(12) United States Patent
Moorby

(10) Patent No.: US 7,143,373 B2
(45) Date of Patent: Nov. 28, 2006

(54) METHOD AND APPARATUS FOR EVALUATING AND DEBUGGING ASSERTIONS

(75) Inventor: Philip R. Moorby, South Hampton, NH (US)

(73) Assignee: Synopsys, Inc., Mt. View, CA (US)

( * ) Notice: Subject to any disclaimer, the term of this patent is extended or adjusted under 35 U.S.C. 154(b) by 161 days.

(21) Appl. No.: 10/965,181

(22) Filed: Oct. 14, 2004

(65) Prior Publication Data

US 2006/0085774 A1     Apr. 20, 2006

(51) Int. Cl.
*G06F 17/50*     (2006.01)
(52) U.S. Cl. .................................. 716/4; 716/2; 716/18
(58) Field of Classification Search .................... 716/1, 716/2, 4, 18; 703/14
See application file for complete search history.

(56) References Cited

U.S. PATENT DOCUMENTS

| | | | |
|---|---|---|---|
| 5,933,356 A * | 8/1999 | Rostoker et al. ................ | 716/6 |
| 6,247,165 B1 | 6/2001 | Wohl et al. | |
| 6,591,402 B1 | 7/2003 | Chandra et al. | |

OTHER PUBLICATIONS

"Smart Verification with VCS 7.0", Synopsys Inc., Apr. 2003, Mountain View, CA.
"VCS Complete RTL Verification Solution", Synopsys Inc. Data Sheet, 2004, Mountain View, CA.
Synopsys VCS Observed Coverage Technology, Synopsys Inc., 2002, Mountain View, CA.
"Assertion-Based Verification", Synopsys Inc., Mar. 2003, Mountain View, CA.
Fitzpatrick, Tom, "Assertions in System Verilog: A Unified Language for More Efficient Verification", Synopsys Inc., Oct. 2003.
"@HDL Updates Products for SystemVerilog and PSL", Press release, Nov. 17, 2003, pp. 1-4, Milpitas, CA.
Maliniak, David, "Assertion-Based Verification Smoothes the Road to IP Reuse", http://www.elecdesign.com/Articles/Print.cfm?ArticleID=2748, visited Jan. 29, 2004, available at Electronic Design Online ID #2748, Sep. 16, 2002.
"SystemVerilog 3.1 Accellera's Extensions to Verilog", Accellera Organization, Inc., 2002, Napa, CA.
"Verilog Hardware Description Language Reference Manual (LRM), Version 1.0", Open Verilog International, Nov. 1991, Sunnyvale, CA.
"Standard Vital ASIC Modeling Specification, Draft, IEEE 1076.4/DI", Institute of Electrical and Electronics Engineers, Inc., Apr. 2000, New York, N. Y.
IEEE Standard VHDL Language Reference Manual, 2000, Piscataway, N. J.

* cited by examiner

*Primary Examiner*—Thuan Do
(74) *Attorney, Agent, or Firm*—Haynes Beffel & Wolfeld LLP

(57) ABSTRACT

Roughly described, assertion expressions are evaluated against the binary signal values of a circuit simulation in such a way as to be able to report status information at intermediate levels of assertion subexpressions. In one embodiment, the status information reported for an intermediate subexpressions contains the final status of that subexpression in response to a given assertion attempt, at least to the extent it has been determined by the end of the evaluation period (e.g. pass, fail or indeterminate). In another embodiment, the status information reported for an intermediate subexpression contains a tick-by-tick analysis of the activity within that subexpression. In another embodiment, the status information for a subexpression can also contain a tick-by-tick analysis of the activity of an operator of the subexpression. Other kinds and levels of detail at the subexpression level can be provided in various other embodiments.

36 Claims, 25 Drawing Sheets

```
                          Stimulus Section
                                   attempt   A # # # # P
                                   b1        1 1 . 1 1 1
                                   b2        . 1 1 1 . 1
                                   b3        1 . . . . 1

Analysis Section
s0 = b1  ##2  b2  ##[ 1:3]  b3               i # # D D A
  b1                                         a
  ##2                                        i # A
  b2                                             a
  ##[ 1:3]                                       i A A A
  b3                                               d d a
```

FIG. 8

STIMULUS SECTION

```
assert (b1 ##2 b2 ##[1:3] b3);
```
                                        0 1 2 3 4 5
                              attempt  A####P
                              b1       (1)1.111
                              b2       .111.1
       ANALYSIS SECTION   b3       1....1

```
s0 = (b1) ##2 b2 ##[1:3] b3
     (b1)
```

STIMULUS SECTION

```
assert (b1 ##2 b2 ##[1:3] b3);  0 1 2 3 4 5
                        attempt A####P
                             b1 11.111
                             b2 .111.1
        ANALYSIS SECTION     b3 1....1
s0 = b1 (##2) b2 ##[1:3] b3       |i
   b1                             +a
   (##2)                          +(i#A)
```

FIG. 11

STIMULUS SECTION

```
assert (b1 ##2 b2 ##[1:3] b3);
                                    0 1 2 3 4 5
                         attempt  A####P
                         b1       11.111
                         b2        ①1.1
```

ANALYSIS SECTION

STIMULUS SECTION

```
assert (b1 ##2 b2 ##[1:3] b3);
                                    0 1 2 3 4 5
                           attempt  A####P
                           b1       11.111
                           b2       .111.1
         ANALYSIS SECTION  b3       1....1
s0 = b1 ##2 b2 ##[1:3] b3           |i
   b1                               |a
   ##2                              |i#A
   b2                               | a
   ##[1:3]                          | iAAA
```

FIG. 13

STIMULUS SECTION

```
assert (b1 ##2 b2 ##[1:3] b3);  0 1 2 3 4 5
                         attempt  A####P
                              b1  11.111
                              b2  .111.1
         ANALYSIS SECTION     b3  1....1
   s0 = b1 ##2 b2 ##[1:3] b3      |i##DDA
      b1                          |a
      ##2                         |i#A
      b2                          | a
      ##[1:3]                     |  iAAA
      b3                          |   dda
```

FIG. 14

STIMULUS SECTION

```
assert (b1 ##2 b2 ##[1:3] b3); 0 1 2 3 4 5
                     attempt A####P
                          b1  11.111
                          b2  .111.1
     ANALYSIS SECTION     b3  1....1
s0 = b1 ##2 b2 ##[1:3] b3    |i##DDA
  b1                         |a
  ##2                        |i#A
  b2                         | a
  ##[1:3]                    |  iAAA
  b3                         |   dd
```

FIG. 15

STIMULUS SECTION

```
assert (b1 ##2 b2 ##[1:3] b3);
                                    0 1 2 3 4 5
                       attempt  A####P
                       b1       11.111
                       b2       .111.1
    ANALYSIS SECTION   b3       1....①
s0 = b1 ##2 b2 ##[1:3] b3       |i##DDA
  b1                            |a
  ##2                           |i#A
  b2                            |  a
  ##[1:3]                       |  iAAA
  b3                            |   dda
```

FIG. 16

```
                              Stimulus Section 0 0 0 0 0 0 0 0 0 0 1 1 1 1 1
                                          0 1 2 3 4 5 6 7 8 9 0 1 2 3 4
                                          - - - - - - - - - - - - - - -
11.                   attempt             A # # # # # # # # # # # # # F
12.                   b1                  1 . . 1 1 . . 1 . 1 1 . . 1 .
13.                   b2                  . 1 . . . 1 . . . . 1 . . . .
14.                   b3                  . 1 1 1 . . 1 1 1 . . 1 1 1 .
15.                   b4                  1 1 . 1 . . . . 1 . . . 1 . .
16.                   b5                  . . 1 1 . . . 1 1 . . 1 1 . 1

Analysis Section 21. s0 = s1 ##1 b5                        |d # D D # D D # D D D D D D
22.    s1 = s2[ * 3:5]                    |d # D D # D D # D D D D D D 31.      *1  s2 = s3 or s4                |d # D D D A
32.          s3 = b1 ##[ 2:5] b2          |i # D D D A
33.              b1                       |a
34.              ##[ 2:5]                 |i # A A A A
35.              b2                       |   d d d a
36.          s4 = b3 ##[ 0:4] b4          |d 41.      *2  s2 = s3 or s4                |         d D A D D
42.          s3 = b1 ##[ 2:5] b2          |         d
43.          s4 = b3 ##[ 0:4] b4          |         d D A D D
44.              b3                       |         a
45.              ##[ 0:4]                 |         a A A A A
46.              b4                       |         d d a d d 51.      *3^ s2 = s3 or s4                |                 d # D D D D
52.          s3 = b1 ##[ 2:5] b2          |                 i # D D D D
53.              b1                       |                 a
54.              ##[ 2:5]                 |                 i # A A A A
55.              b2                       |                   d d d d
56.          s4 = b3 ##[ 0:4] b4          |                 d
```

FIG. 18

METHOD AND APPARATUS FOR EVALUATING AND DEBUGGING ASSERTIONS

COPYRIGHT DISCLAIMER

A portion of the disclosure of this patent document contains material which is subject to copyright protection. The copyright owner has no objection to the facsimile reproduction by anyone of the patent document or the patent disclosure as it appears in the U.S. Patent and Trademark Office patent file or records, but otherwise reserves all copyright rights whatsoever.

BACKGROUND

1. Field of the Invention

The invention relates to electronic design automation, and more particularly to techniques for assertion-based verification of electronic designs.

2. Description of Related Art

An electronic design automation (EDA) system is a form of computer aided design (CAD) system used for designing integrated circuit (IC) devices. The EDA system typically receives one or more high level behavioral descriptions of an IC device (e.g., in hardware description languages like VHDL, Verilog, etc.) and translates this high level design language description into netlists of various levels of abstraction. At a higher level of abstraction, a generic netlist is typically produced based on library primitives. The generic netlist can be translated into a lower level technology-specific netlist based on a technology-specific library. A netlist describes the IC design and is composed of nodes (elements) and edges, e.g., connections between nodes, and can be represented using a directed cyclic graph structure having nodes which are connected to each other with signal lines. The netlist is typically stored in computer readable media within the EDA system and optimized, verified and otherwise processed using many well known techniques. The netlist may then be used to generate a physical device layout in mask form which can be used to directly implement structures in silicon to realize the physical IC device.

At several points in the design process, it is useful to be able to simulate and test the design, or parts of the design, to verify that it operates logically as desired. If errors are found, then the design is modified or corrected in iterative fashion as necessary. Several methods are known for testing circuit designs. In one method, software models of the design are created and the software models are tested against designer-specified test cases. In other methods, each component in the design is modeled as a state transition system and described using logic formulas. All possible behaviors of the circuit design are then exercised to confirm that the design performs in accordance with the state transition logic formulas. The latter methods are more exhaustive than the former, but can require huge amounts of time and computing power to generate and execute.

A more recent design verification method, known as assertion-based verification, involves testing a simulation of the circuit against one or more assertions describing how the circuit should behave. An "assertion" is a statement that a certain property must be true, for example, that a read_request must always be followed by a read_grant within two clock cycles. Assertions allow for automated checking that the specified property is true, and can generate automatic error messages if the property is not true. Industry organizations have defined standardized assertion languages that designers can use to specify their assertions, and for which tool vendors have developed automated checking tools.

Assertion languages often support two kinds of assertions: concurrent and immediate. Immediate assertions, sometimes also called combinational assertions, follow simulation event semantics for their execution and are executed like a statement in a procedural block. Concurrent assertions, on the other hand, are based on clock semantics and use time-sampled values of variables. Concurrent assertions are sometimes also called sequential assertions. Like many formal verification tools, concurrent assertion verification tools evaluate circuit descriptions using a cycle-based semantic, which typically relies on a clock signal or signals to drive the evaluation of the circuit. Any timing or event behavior between clock edges is abstracted away.

Tools have been developed by EDA vendors to evaluate assertions against simulations of a logic design. Typically the tool compiles the assertion language statements into one or more state machines or other automata, which are used to follow along, clock tick by clock tick, with the execution of the circuit simulation. The state machines each start running anew (begin a new "attempt") at each clock tick, and continue until they report that their corresponding assertion expression has either passed or failed in that attempt, or the simulation terminates (in which case they report an indeterminate result). Concurrent assertions usually require many clock ticks before pass or fail can be determined, so since each new clock tick begins a new attempt, multiple instances of the state machine representing multiple attempts for a given assertion are usually executing concurrently.

In order to produce fast simulations, the state machines for assertion-based verification are usually highly optimized for speed and efficiency. Unfortunately, the resulting state machines usually bear little or no resemblance to the original assertion expression to the average user. Verification tools therefore usually report whether an assertion passed or failed, and if it failed then for which attempt it failed, but usually cannot provide any further information about the failure. Even where the tools provide information about the state of the state machine upon failure, the average user has no way to relate such information to either the assertion expression or the circuit design. Designers therefore know that the circuit design failed to perform in accordance with the assertion, but do not know whether the error was in the design or in the assertion expression, much less know where in the design or where in the assertion expression the error occurred.

The debugging process in many engineering disciplines often advantageously involves a "divide-and-conquer" methodology, in which tests are performed on successively smaller pieces until the error is isolated. But modern assertion-based verification tools do not provide any significant assistance in facilitating that process. Graphical user interface tools using the same state machine output information can help somewhat, but even these tools still have the same fundamental issue of not helping the user to divide-and-conquer the problem. In short, assertion-based verification tools to date have been able to report pass/fail, but have not been able to provide assistance in debugging either the circuit design or the assertion expression.

The problem is made worse by the trend in the EDA industry toward encouraging designers to specify more of their own assertions, as well as the trend toward much more complex assertions. In light of these problems with prior art assertion-based verification tools, there is a serious need for new mechanisms and tools that will not only report pass/fail of an assertion, but also assist the user in debugging either the circuit design or the assertion expressions themselves.

SUMMARY OF THE INVENTION

According to the invention, roughly described, assertion expressions are evaluated against the binary signal values of a circuit simulation in such a way as to be able to report status information at intermediate levels of assertion subexpressions. In one embodiment, the status information reported for an intermediate subexpressions contains the final status of that subexpression in response to a given assertion attempt, at least to the extent it has been determined by the end of the evaluation period (e.g. pass, fail or indeterminate). In another embodiment, the status information reported for an intermediate subexpression contains a tick-by-tick analysis of the activity within that subexpression. In another embodiment, the status information for a subexpression can also contain a tick-by-tick analysis of the activity of an operator of the subexpression. Other kinds and levels of detail at the subexpression level can be provided in various other embodiments.

In an embodiment, a recursive descent algorithm is used to evaluate the assertion expression. The assertion expression is first parsed into a tree structure, which is then evaluated for some set of attempt times over a finite time interval. The algorithm advantageously caches assertion "sub-attempt" results at each node in the tree so as to improve efficiency. The algorithm produces complete activity trace information over the entire time window, and does not require a state machine to be generated. The information generated is associated with each node of the expression tree, is user-understandable, and allows divide-and-conquer inspection of the complete assertion results. This means that during the debug process, a user may obtain information for any given temporal subexpression in isolation from the remaining parts of the expression tree, and thus focus on specific and relevant data for finding bugs. The data generated is also very useful for the understanding of arbitrarily complex assertions.

BRIEF DESCRIPTION OF THE DRAWINGS

The invention will be described with respect to specific embodiments thereof, and reference will be made to the drawings, in which:

FIG. 8 illustrates a sample assertion analysis report.

FIGS. 9–17 illustrate how the report of FIG. 8 can be interpreted.

FIG. 18 illustrates another sample assertion analysis report.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
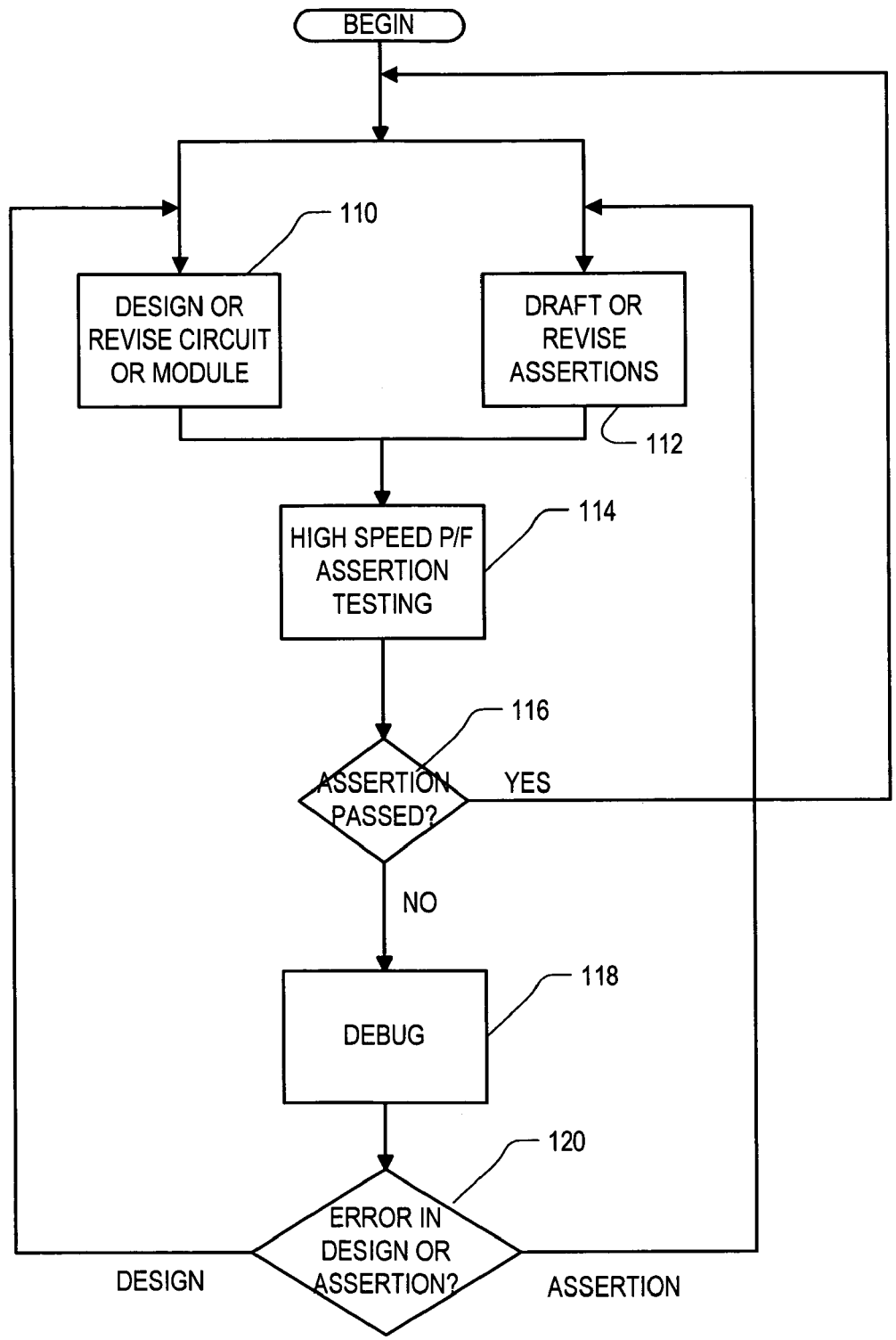
FIG. 1 is an overall flowchart of a process incorporating the invention, that might be undertaken by a designer or design team developing a circuit or module.

FIG. 1 is an overall flowchart of a process incorporating the invention, that might be undertaken by a designer or design team developing a circuit or module. Initially, at step 110, the designer designs a circuit or module using, for example, a CAD tool. For purposes of the present invention, the design performed at step 110 might occur at any level, including the system-level, the module level, the gate level, the transistor level, the layout level or at the level of routing and placement, or at any other level that might be desired. The circuit design process of step 110 might include revision of a previously designed to circuit or module. In step 112, the designer prepares or revises assertions that may be used to test the functionality of the designs prepared in step 110. Assertions may be written in any assertion language in various embodiments, but typically they will be written in a language compatible with the hardware description language produced in step 110. For example, if the circuit design produced in step 110 is written using System Verilog, then the assertions prepared in step 112 are preferably written using the concurrent assertions semantics of System Verilog.

Step 112 is shown occurring in parallel with step 110 in FIG. 1, but in various embodiments it may occur before, during and/or after the design or revision of the circuit or module in step 110. For all flowcharts herein, it will be understood that many of the steps can be combined, performed in parallel or performed in a different sequence without affecting the functions achieved.

The concurrent assertions semantics of System Verilog are described in Accellera Organization, Inc., "System Verilog 3.1: Accellera's Extensions to Verilog®" (2003), especially Sections 14, 17, 27 and Appendix G. The entire document is incorporated herein by reference. As described at Section 17.3, the evaluation model for concurrent assertions in System Verilog 3.1 is based on a clock such that a concurrent assertion is evaluated only at the occurrence of a clock tick. The values of variables used in the evaluation are the sampled values. The definition of a clock is explicitly specified by the user and can vary from one expression to another. A clock tick is considered an atomic moment of zero duration, that occurs only once at any simulation time. The sampled values for that simulation time are the signal values used for evaluation. In a System Verilog 3.1 assertion, the sampled value is the only valid value of a variable at a clock tick. The sampled values are used to evaluate value change expressions or boolean subexpressions that are required to determine a match with respect to a sequence expression.

In System Verilog, an assertion expression describes a sequence of signals that is required to occur. The syntax offers much flexibility in specifying sequences. For example, sequence specifications can be concatenated using the '##N' operator, to specify that a second sequence must follow a first sequence beginning N clock ticks after the first sequence completes (N>=0). The operator '##N' is known both as a cycle delay operator and as a concatenation operator. Thus the expression s0 ##3 s1 requires that subexpression s0 accurately describe a sequence produced by the circuit design, and that s1 also accurately describe a different sequence beginning 3 clock ticks after the tick on which the first sequence completes. Both subexpressions s0 and s1 are considered herein to be "operands" of the operator '##3'. In addition, s0 and s1 are sometimes referred to herein as being "prefix" and "suffix" operands of the operator '##3" since s1 is required to begin no earlier than the completion of s0.

Similarly, the expression s0 ##N s1 ##M s2 requires that subexpression s0 accurately describe a sequence produced by the circuit design, and that s1 also accurately describe a different sequence beginning N clock ticks after a tick on which the first sequence completes successfully, and further that s2 accurately describe yet another sequence beginning M clock ticks after a tick on which the second sequence s1 completes successfully. All three subexpressions s0, s1 and s2, as well as the cycle delay specifications '##N' and '##M', must pass in order for the overall expression to pass. For the '##N' operator, s0 is sometimes referred to herein as the prefix operand, and s1 is sometimes referred to herein as the suffix operand. In addition, since (s1 ##M s2) itself constitutes a subexpression of its own, the subexpression (s1 ##M s2) can also be referred to herein as the suffix operand. Similarly, for the '##M' operator, either s1 or (s0 ##N s1) can be considered to be the prefix operand, and s2 would be the suffix operand.

In addition to the cycle delay operator ##N, many other operators and syntax features usable in System Verilog assertion statements are described in the above-incorporated System Verilog 3.1 document, and will not be repeated here. However, it will be useful to describe here one more operator, the consecutive repetition operator '[*'. This operator, which is a unary operator preceded by its operand, allows a statement to specify that a particular sequence is to be consecutively repeated with one cycle delay between repetitions. For example, the following expression specifies the consecutive repetition of an expression 's1' three times within the sequence:

s0 ##1 s1 [*3] ##1 s2

This expression is equivalent to the expression s0 ##1 s1##1 s1##1 s1##1 s2

The subexpressions s0, s1 and s2 themselves can be arbitrarily complex. For example, the consecutive repetition syntax can be used to specify repetitions of sequences which themselves contain concatenation operators. For example, (a ## 2b) [*5]

is the same as (a##2 b ##1 a ##2 b ##1 a##2 b ##1 a##2 b 1 a##2 b).

A repetition with a range of minimum and maximum numbers of times can be expressed with [* min:max]. As an example, the expression:

(a ##2 b)[*1:4]

is equivalent to the expression:

(a ##2 b) or (a ##2 b##1 a ##2 b) or (a ##2 b ##1 a ##2 b ##1 a ##2 b) or (a ##2 b ##1 a ##2 b ##1 a ##2 b ##1 a ##2 b)

Similarly, the expression:

(a[*0:3] ##1 b ##1 c)

is equivalent to the expression:

(b ##1 c) or (a ##1 b ##1 c) or (a ##1 a ##1 b ##1 c) or (a ##1 a ##1 a ##1 b ##1 c)

To specify a potentially infinite number of repetitions, the dollar sign ($) is used. The repetition:

a ##1 b[*1:$] ##1 c means 'a' is true on the current sample, then 'b' shall be true on every subsequent sample until 'c' is true. On the sample on which 'c' is true, 'b' does not have to be true.

Returning to FIG. 1, in step 114, the design is first tested using a high-speed pass/fail assertion testing mechanism such as VCS® 7.0, available from Synopsys, Inc. Such a mechanism is designed and optimized for speed of testing, and therefore provides minimal information to assist in debugging any assertion test failure. VCS will report whether each assertion passed or failed overall, or whether the result was indeterminate because it neither passed or failed by the time the simulation terminated. For assertion failures, VCS will also report which attempt or attempts of the assertion failed (by reporting the clock tick of the circuit simulation on which the failed attempt began), as well as the clock tick on which it failed. VCS may also report the temporal sequence of logic values of the input variables used in the assertion (the "stimulus"). This is usually not enough information to provide meaningful debugging assistance.

Accordingly, if the assertion or assertions passed (step 116), then either the design is complete and ready to move to the next level, or additional features can be designed into the circuit or additional modules can be designed. If one or more of the assertions failed, then the design process continues to a debug step 118 incorporating features of the invention. Among other things, the debug step 118 often provides sufficient information for the designer to determine, among other things, whether the error that caused the assertion to fail was in the circuit design or in the assertion expression. If it was in the circuit design (step 120), then the designer returns to step 110 to revise the circuit design. If the error was in the assertion statement, then the designer returns to step 112 to revise the assertion statement.

It will be appreciated that in another embodiments, the debug facilitation features in step 118 can be incorporated into the high-speed assertion testing step 114, thereby further reducing the time and difficulty involved in designing and verifying circuits and modules.

Figure 2:
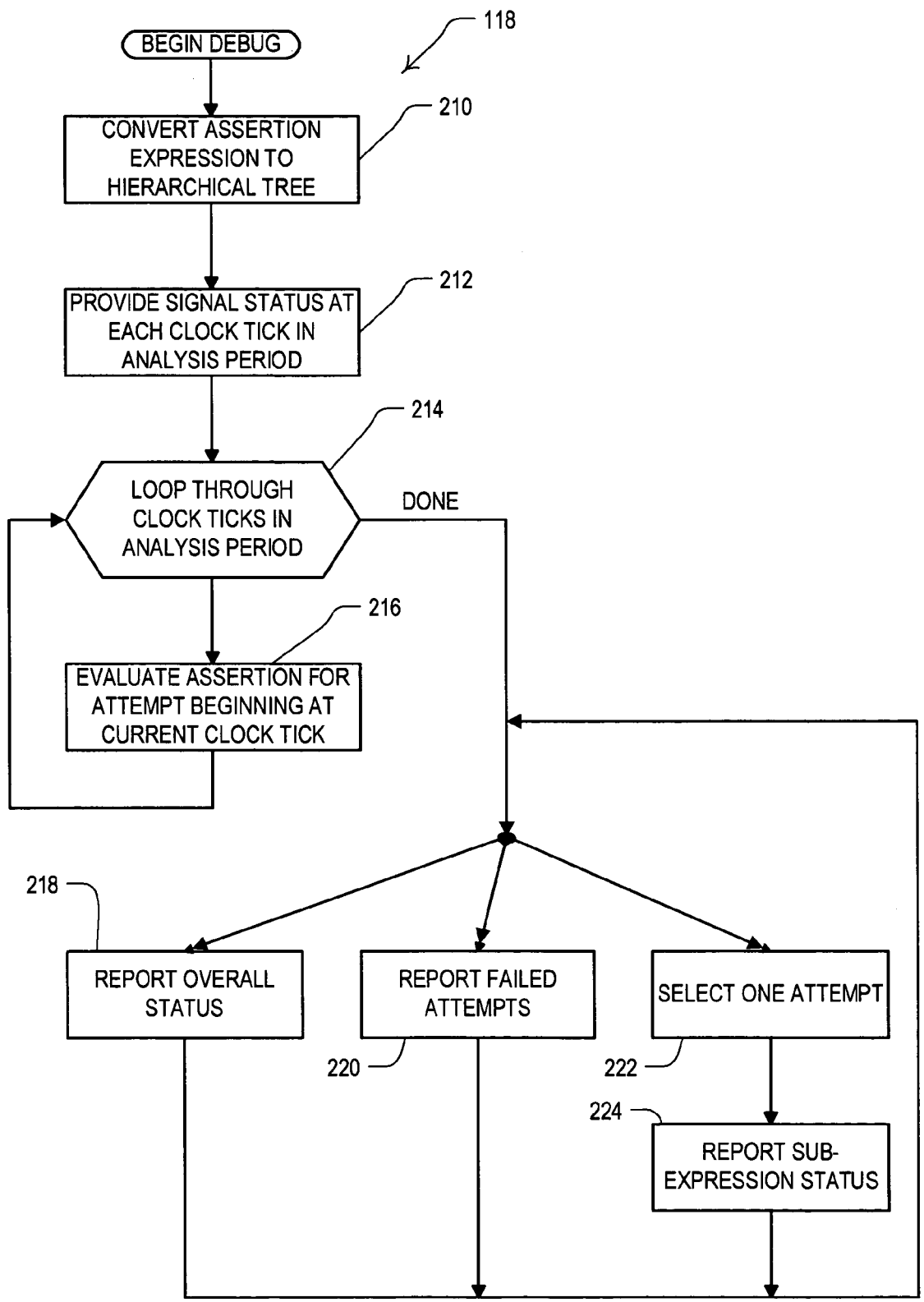
FIG. 2 is a flowchart of debug step of FIG. 1.

FIG. 2 is a flowchart of debug step 118 of FIG. 1. In step 210, the assertion expression is broken up into a hierarchy of subexpressions. The hierarchy of subexpressions for a given assertion expression is best visualized as a tree structure, and in a preferred embodiment, step 210 does in fact create a tree data structure.

As an example, consider the following assertion expression written using System Verilog 3.1 concurrent assertions semantics:

assert ((b1 ##[2:5] b2) or (b3 ##[0:4] b4))[*3:5] ##1 b5;  (Expression A)

This expression is written in terms of five signal values (variables) b1, b2, b3, b4 and b5. The signal values can represent outputs of the logic circuit under test, or inputs to the logic circuit, or signals internal to the logic circuit being tested. The expression has a "main" operator, '##1', the cycle delay operator. The expression also has two operands: '(b1 ## [2:5] b2) or (b3 ## [0:4] b4)) [*3:5]' on the left and 'b5' on the right. If the overall assertion expression is given the name 's0', then the left-hand subexpression may be identified as s1.

The '##N' operator is a binary operator, meaning it takes two operands. Other operators are unary (take only a single operand) or take three or more operators. For expressions that include more than one operator, the "main" operator of the expression is considered to be the operator having the lowest priority in the order of operations defined by the assertion language, after taking parentheses into account. If the expression has more than one operator at the lowest priority level, then it does not matter (except perhaps for optimization purposes) which operator is considered the "main" operator.

Each of the operands of the main operator in the above expression is itself an expression, as well as being a subexpression of the overall expression s0. The right-hand operand, b5, is irreducible, but the left-hand operand s1 can be further reduced into an operator operating on additional expressions, each of which is a subexpression of the original left-hand operand s1. The subexpressions of the original left-hand operator s1 are also considered herein to be subexpressions of the original overall expression s0. Thus as used herein, an "expression" can be represented in terms of one or more "subexpressions", which can themselves be considered to be expressions. A subexpression can be irreducible, meaning it contains no operators (e.g. a binary constant or a bare signal value), or further reducible, meaning it still contains at least one operator (unary, binary or other). If it is further reducible, then the subexpression can be represented further in terms of one or more further subexpressions, and so on, down to final expressions which are referred to herein as "leaf expressions". Note that a given embodiment can be designed to not reduce expressions all the way to their irreducible subexpressions. In the present embodiment, for example, expressions are broken down only to the point of constants, binary signal variables, and purely combinational functions of constants and binary signal variables, and not further.

Figure 3:
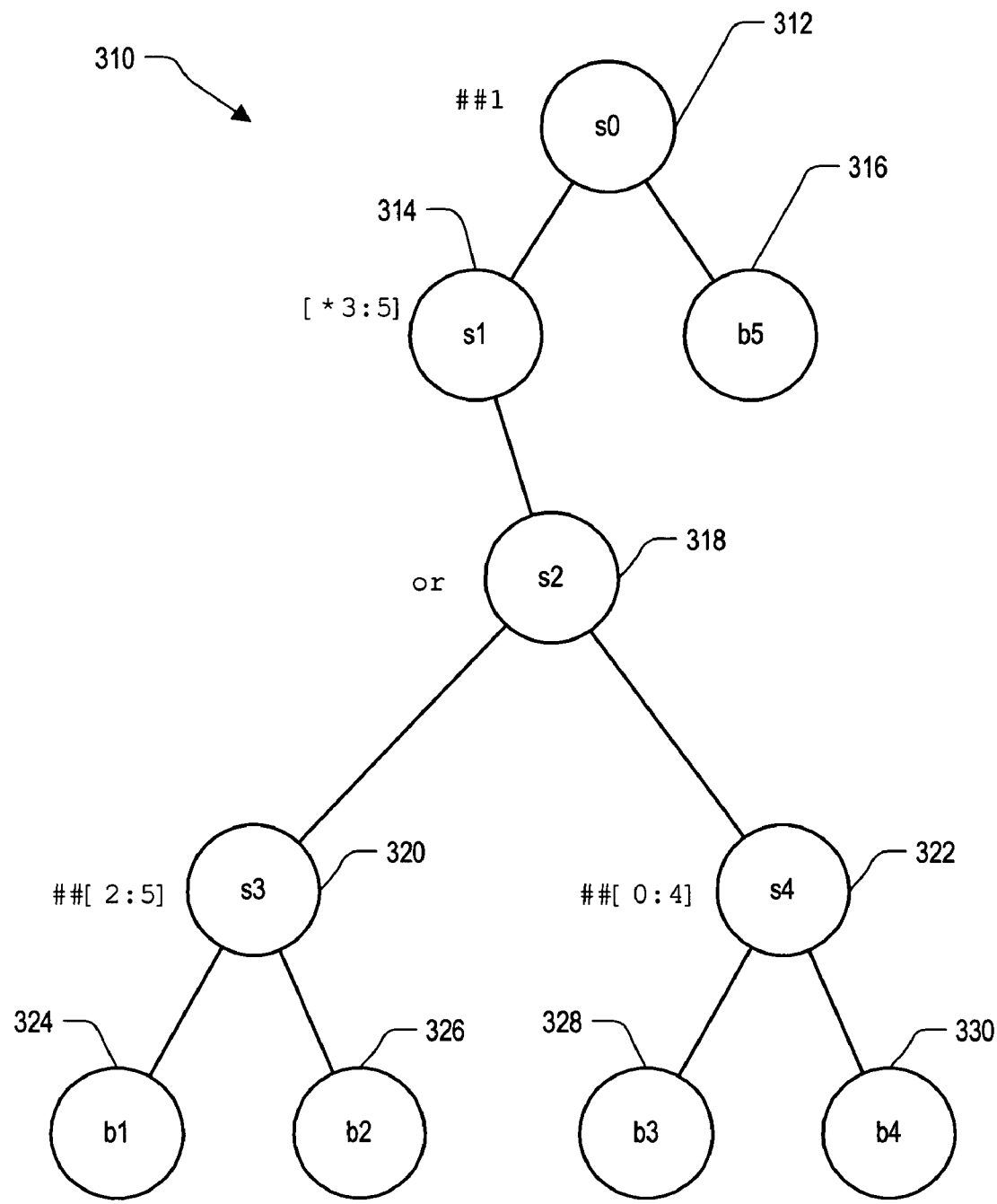
FIGS. 3 and 4 illustrate assertion expression tree structures.

Referring to FIG. 3, it can be seen that the above assertion expression has been represented as a tree 310, with the root node 312 at the top, leaf nodes 316, 324, 326, 328 and 330 at the extremities, and intermediate nodes 314, 318, 320 and 322 in between. Each node other than the leaf nodes is identified on the drawing by a subexpression identifier s0, s1, s2, s3 or s4, and has associated therewith the main operator of the expression or subexpression which it represents. Each node other than the leaf nodes is also the root node of a subtree, which like the term "subexpression", is itself considered herein to be a tree in its own right. Thus the root node 312 of the overall tree 310 has associated therewith the main operator '##1'. The children of the root node are represented by two other nodes 314 and 316. Node 316 is the leaf node representing the right hand subexpression b5 of the root node expression s0, and node 314 is the left-hand node representing the left-hand subexpression of the root node expression s0. Node 314 has associated therewith the operator '[*3:5]', which is the main operator of the subexpression s1. The operator '[*3:5]' is a repetition operator, the sole operand of which is a subexpression s2 given by '(b1 ##[2:5] b2) or (b3 ##[0:4] b4)'. Thus node 314 has only node 318 as a child node, for subexpression s2. The main operator of s2, 'or', is also associated with the node 318 in FIG. 3. The subexpression s2 has two operands given by s3: (b1 ## [2:5] b2) and s4: (b3 ## [0:4] b4), which are shown in the drawing as child nodes 320 and 322, respectively, of node 318. The main operator of s3, '##[2:5]', is shown on the diagram as being associated with node 320, and the main operator of s4, '##[0:4]', is shown on the diagram as being associated with the node 322. The subexpression s3 has only the primitive operands b1 and b2, so these are shown as child nodes 324 and 326, respectively, of intermediate node 320. Similarly, the subexpression s4 has only the primitive operands b3 and b4, so these are shown as child nodes 328 and 330 of intermediate node 322.

Figure 4:
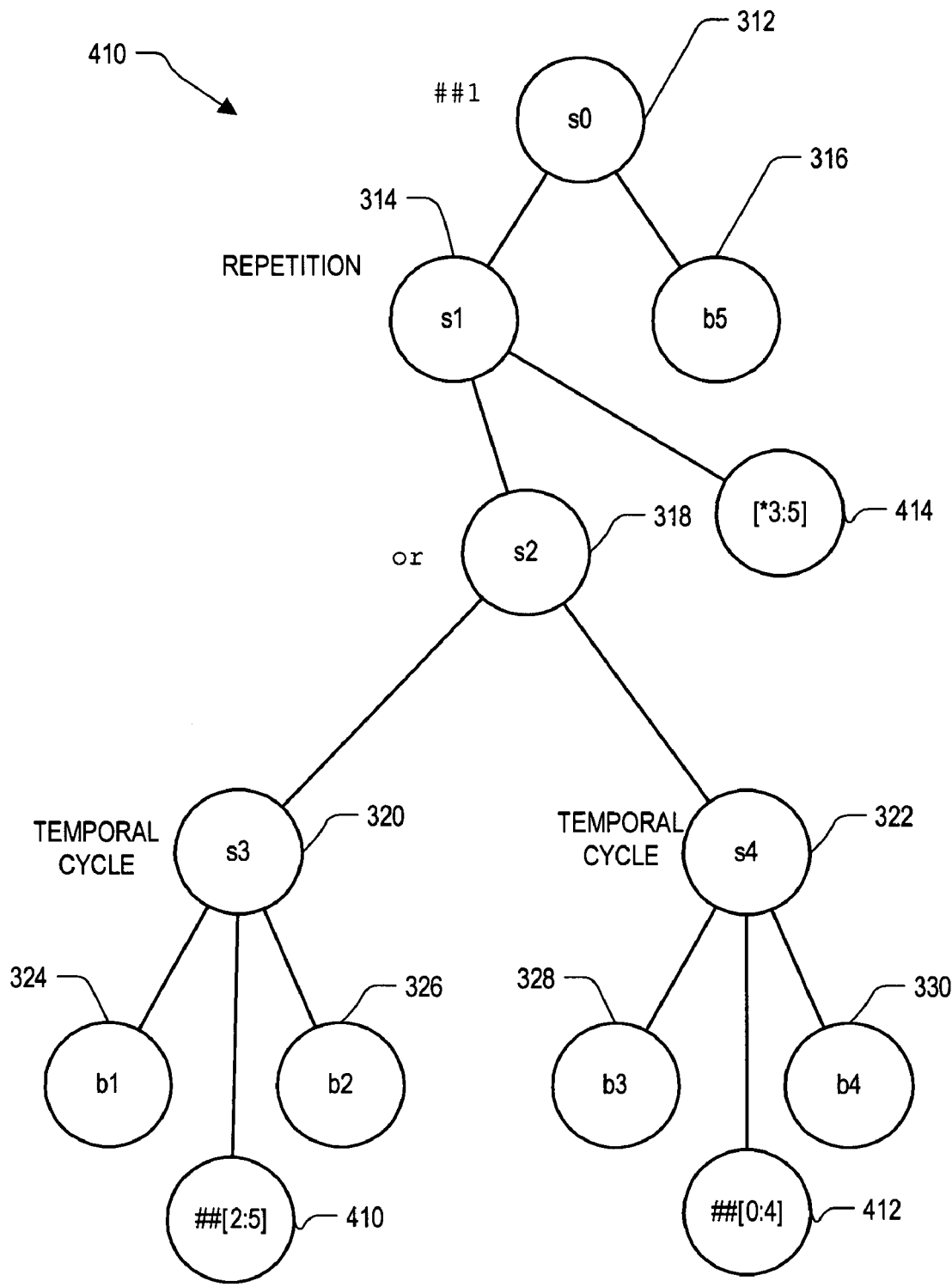

In an embodiment, processing is simplified by adding a few additional nodes to the tree of FIG. 3. As shown in FIG. 4, in tree 410, the cycle delay operators ##[2:5] for node 320 and ##[0:4] for node 322 have been abstracted as generalized cycle delay operators, identified as '##N' operators. The specifics of these operators are represented in the tree as additional dummy child nodes 410 and 412 of nodes 320 and 322, respectively, disposed between the two operand child nodes. Similarly, the repetition operator [*3:5] associated with node 314 is abstracted out to a generalized repetition operator *N, and the specifics are represented in the tree as a separate child dummy node 414 to the right of the operand child node 318. The reasons for these modifications will become apparent below with respect to FIGS. 19–24 and the Appendix.

Many conventional algorithms are known for parsing an expression, such as assertion expression s0, into a tree structure. One algorithm that might be used is as follows:
1. Tree=createSubtree(assertionExpression)
2. createSubtree(currentSubExpression)
   a. identify main operator of currentSubExpression;
   b. instantiate object currentNode of the type appropriate to the main operator;
   c. if currentSubExpression is sufficiently granular for leaf node, return currentNode;
   d. identify the main operand subexpressions S1, i=1, . . . of the main operator;
   e. For each main operand subexpressions S1 of currentSubExpression:
      (1) currentNode.child[i]=createSubtree(Si);
   f. identify any auxiliary subexpressions and add them to the child nodes:
      (1) for a cycle delay operator, add createSubTree(## [m.n]) between the 2 operands
      (2) for repetition operator, add createSubTree(##1) after operand g. return currentNode;

In the resulting tree structure, each node is represented by a node object containing the following information:

1. identification of the main operator associated with the current node, in the form of a pointer to the respEvalTick method for the operator
2. pointers to each child node
3. pointer to the respEvalSet method (common for all nodes, in the present embodiment)
4. an ALBs vector (cached results from prior calls to the object's respEvalTick method)
5. storage for As,maxL,B and other variables for holding intermediate results
6. for leaf nodes only, pointer to stimulus data structure (structure indicating the values of all signal variables used in the assertion expression).

The respEvalTick methods, the respEvalSet method, the ALBs vectors, 'As,maxL,B', and the stimulus data structure are all described hereinafter.

Returning to FIG. 2, after the assertion expression has been converted to a tree structure, in step 212 the stimulus data structure is created or otherwise provided to the debug system. In a preferred embodiment, the values of all the signal variables used in the assertion expression (as well as other signal variables, optionally), at each tick in the entire analysis period, are developed in their entirety before evaluation of the assertion expression against the stimulus begins. In other embodiments the variable values might be developed dynamically, in parallel with the assertion expression evaluation process.

Figure 5:
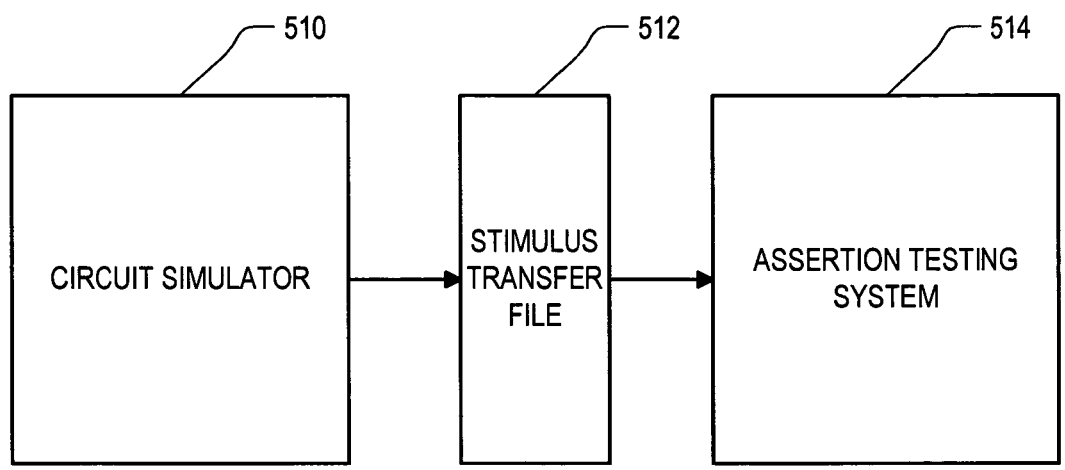
FIG. 5 illustrates a model by which the stimulus data may be provided to an assertion testing system.

FIG. 5 illustrates one model by which the stimulus data may be provided. As shown therein, a simulator 510 is used to simulate the operation of the logic circuit, and the values of the pertinent signal variables are captured for every clock tick. These values are written into a data structure in a stimulus transfer file 512, from which the assertion testing system 514 retrieves them for analysis against the assertions. In other embodiments, variable values can be passed to the assertion testing system via other mechanisms, such as by interprocess communication, shared memory spaces, and so on. Alternatively, the stimulus data may be provided from a source (through a file or any other mechanism) that is unrelated to any real circuit design.

As yet another alternative, the assertion testing system 514 might be incorporated directly into the circuit simulator, and the signal values transferred dynamically, such as through an API. This alternative may be particularly advantageous since the stimulus can be developed dynamically, and provided to the assertion testing system as they are developed. The simulation period therefore can be allowed to continue for as long as desired until a definite Pass or Fail occurs, or until the designer desires to terminate with indeterminate results.

Numerous examples of simulators are known and usable as the circuit simulator 510 of FIG. 5. For designs expressed in System Verilog, it is preferred that the simulator operate in accordance with the System Verilog simulation reference algorithm set forth at Section 14.3.1 of the above-incorporated System Verilog 3.1 document. Greatly simplified, this algorithm involves first compiling the hardware description code into a network of nets and variables, and then calling an "execute_simulation" method described by the following pseudocode:

```
execute_simulation {
    T = 0;
    initialize the values of all nets and variables;
    schedule all initialization events into time 0 slot;
    while (some time slot is non-empty) {
        move to the next future non-empty time slot and set T;
        execute_time_slot (T);
    }
}
execute_time_slot(T) {
    while (time_slot is non-empty) {
        E = any event from time_slot;
        remove E from the time_slot;
        if (E is an update event) {
            update the modified object;
            evaluate processes sensitive to the object and possibly schedule
            further events for execution;
        } else { /* E is an evaluation event */
            evaluate the process associated with the event and possibly
            schedule
            further events for execution;
        }
    }
}
```

The simulation executed by the circuit simulator 510 covers a range of clock ticks referred to herein as the simulation period. In a typical embodiment the simulation period always begins with time 0, the earliest clock tick of the simulation, and can continue for as long as desired in order to fully execute the desired tests. Initial conditions for all signal variables are pre-established before the first clock tick. For assertion testing, the designer might wish to analyze the signal variable sequences either for attempts beginning throughout the entire simulation period, or only for attempts beginning within a smaller window of clock ticks, referred to herein as the analysis period. The simulation period thus may be co-extensive with the analysis period, or it can be longer than the analysis period, but it always includes the analysis period. In one embodiment, the analysis period can be considered to begin with the earliest assertion attempt and end with the last assertion attempt, although the evaluation of assertion attempts can continue beyond the end of the analysis period up to the end of the simulation period. The period through which evaluation of assertion attempts occurs is sometimes referred to herein as an evaluation period. If the simulation period extends beyond the end of the analysis period, then in various embodiments the evaluation period might end with the analysis period, or with the entire simulation period, or sometime in between.

Figure 6:
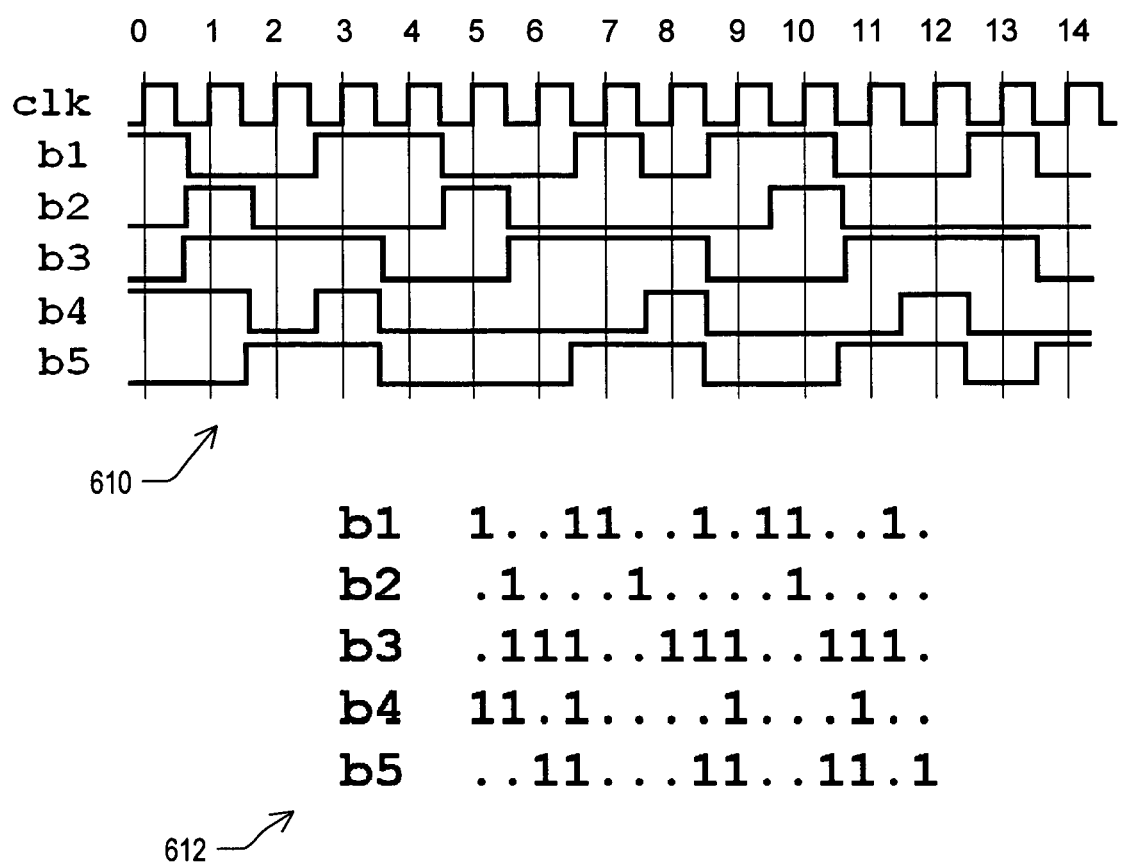
FIG. 6 illustrates an example signal sequence that might be generated by a circuit simulator.

FIG. 6 illustrates an example signal sequence 610 that might be generated by circuit simulator 510 through a simulation period beginning at a clock tick 0 and ending at a clock tick 14, for signals b1, b2, b3, b4 and b5. Also shown is a matrix representation 612 of the signal values, with each row representing a respective signal and each column representing a respective clock tick. The value in each cell of the matrix is either '1', indicating a logic 1 on that clock tick, or '.', indicating a logic 0 on that clock tick. The matrix 612 can also be thought of as five temporal vectors, one for each variable b1–b5, each vector containing the logic level on each clock tick in the simulation period. The stimulus may be provided to the assertion testing system 514 in this format or another format. One particularly advantageous format, for reasons which will become apparent, is a set format in which the set contains only a list of 'alive' ticks for the variable. An 'alive' tick is a clock tick on which the variable contains a logic 1. The clock ticks held in these sets are simple integer numbers 1, 2, 3, . . . , which map directly onto the actual clock tick numbers of the simulation. That is, the simulation times at which the actual clock ticks occur are abstracted into the sequence 1, 2, 3, . . . . In this format, the stimulus shown in FIG. 6 would be provided to the assertion testing system 514 in the form of the following five sets:

b1={0,3,4,7,9,10,13}
b2={1,5,10}
b3={1,2,3,6,7,8,11,12,13}
b4={0,1,3,8,12}
b5={2,3,7,8,11,12,14}

In various embodiments, the stimulus transferred to the assertion testing system 514 might include only the desired signal values for only the desired analysis period, whereas in other embodiments the stimulus transferred might also include values for more signals than needed or values for a longer time period than needed, or both.

Figure 25:
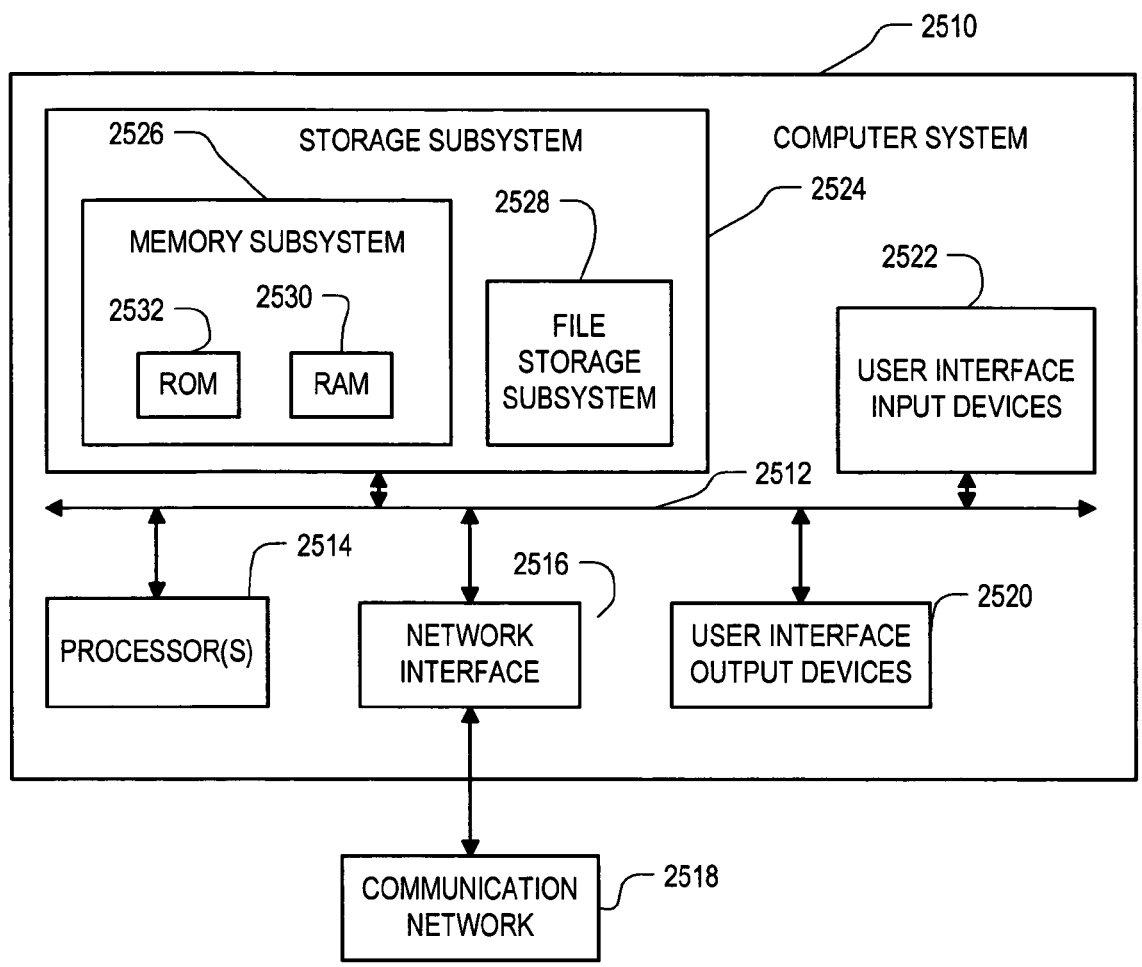
FIG. 25 is a simplified block diagram of a platform that can be used to implement an assertion testing system incorporating the invention.

The assertion testing system 514 can be implemented on any special or general purpose computing platform. FIG. 25 is a simplified block diagram of a suitable platform. As shown in FIG. 25, the platform is a computer system 2510 including at least one processor 2514 which communicates with a number of peripheral devices via bus subsystem 2512. These peripheral devices may include a storage subsystem 2524, comprising a memory subsystem 2526 and a file storage subsystem 2528, user interface input devices 2522, user interface output devices 2520, and a network interface subsystem 2516. The input and output devices allow user interaction with computer system 2510. Network interface subsystem 2516 provides an interface to outside networks, including an interface to a communication network 2518, and is coupled via communication network 2518 to corresponding interface devices in other computer systems. Communication network 2518 may itself comprise many interconnected computer systems and communication links. These communication links may be wireline links, optical links, wireless links, or any other mechanisms for communication of information.

Storage subsystem 2524 stores the basic programming and data constructs that provide the functionality of the present embodiment. For example, the various modules implementing the functionality of the present embodiment may be stored in storage subsystem 2524. These software modules are generally executed by processor 2514.

Memory subsystem 2526 typically includes a number of memories including a main random access memory (RAM) 2530 for storage of instructions and data during program execution and a read only memory (ROM) 2532 in which fixed instructions are stored. File storage subsystem 2528 provides persistent storage for program and data files, and may include a hard disk drive, a floppy disk drive along with associated removable media, a CD-ROM drive, an optical drive, or removable media cartridges, among other things. The databases and modules implementing the functionality of the present embodiment may be stored by file storage subsystem 2528.

Bus subsystem 2512 provides a mechanism for letting the various components and subsystems of computer system 2510 communicate with each other as intended. Although bus subsystem 2512 is shown schematically as a single bus, alternate embodiments of the bus subsystem may utilize multiple busses.

Computer system 2510 itself can be of varying types including a personal computer, a portable computer, a workstation, a computer terminal, a network computer, a television, a mainframe, or any other data processing system or user device. Due to the ever-changing nature of computers and networks, the description of computer system 2510 depicted in FIG. 25 is intended only as a specific example for purposes of illustrating an embodiment of the present invention. Many other configurations of computer system 2510 are possible having more or less or different components than the computer system depicted in FIG. 25.

Returning again to FIG. 2, in step 212, the system begins a loop through all the clock ticks in the analysis period. In step 216, the system evaluates the assertion for an attempt beginning at the current clock tick. Step 216 is described in more detail hereinafter. When the evaluation of the current attempt completes (whether by pass, fail or indeterminate because evaluation terminated while the attempt was still alive), the system then loops back to step 214 to evaluate an attempt beginning at the next clock tick, and so on until attempts are evaluated beginning at each clock tick in the analysis period. Although the semantics of concurrent sequential assertion testing state that an assertion attempt is to be initiated on each and every clock tick, and that all must independently pass for the assertion to pass overall, it will be appreciated that in other embodiments, attempts may be initiated at fewer than all of the clock ticks in the analysis period; for example they may be initiated only at every second or third clock tick, or only at one or more specific clock ticks pre-designated by the user.

Figure 7:
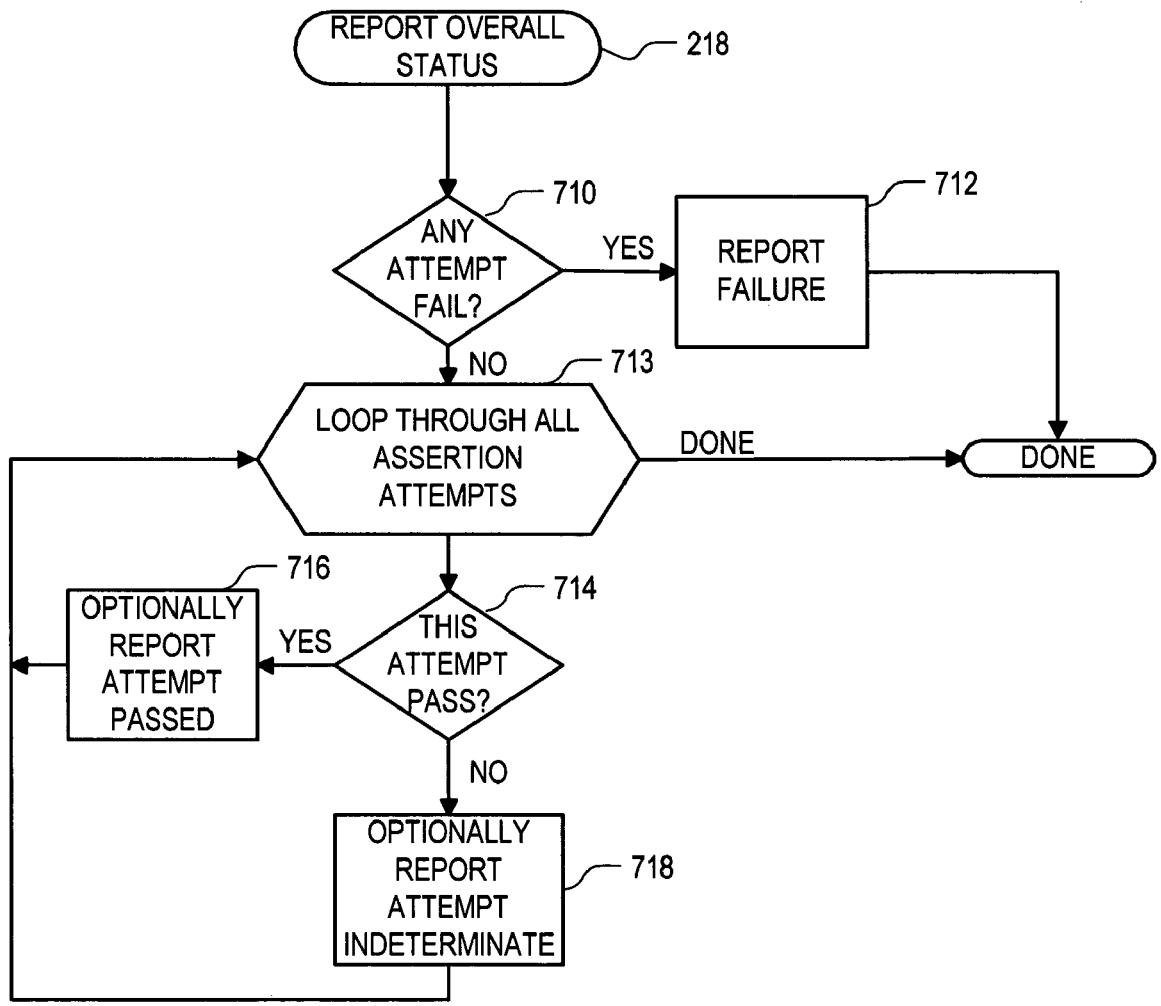
FIG. 7 is a flowchart detail of the step in FIG. 2 of reporting overall status.

As previously mentioned, most conventional design verification tools report only whether an assertion passed or failed, or remains indeterminate at the end of the simulation. If the assertion failed, then conventional tools often can report for which attempt it failed. This kind of reporting is available in the system of FIG. 2 as well, in step 218. FIG. 7 is a flowchart detail of step 218. As indicated therein, in step 710, it is first determined whether any of the attempts evaluated in step 216 failed. If so, then in step 712, the system reports failure of the assertion overall. If not, then in step 713, the system loops through all the assertion attempts. For each one, in step 714, the system determines whether the assertion passed. If so, then the system may optionally report the pass (step 716). If not, then the attempt is considered indeterminate, and the system may optionally report this information (step 718).

Returning to FIG. 2, where at least one attempt failed, the assertion testing system 514 can also report which attempt or attempts failed. In step 220, the system does so by reporting the clock tick number(s) on which the failed attempt(s) were initiated.

Unlike conventional assertion testing systems, the assertion testing system 514 can also report status of an assertion attempt at a much more detailed level than simply pass/fail/indeterminate. In particular, assertion testing system 514 can report the pass/fail/indeterminate status of the assertion attempt at each subexpression in the assertion expression, and further can report the tick-by-tick evaluation status of the assertion attempt at each subexpression in the assertion expression. Thus in step 222, the user selects an assertion attempt to analyze, usually but not necessarily a failed assertion attempt, and in step 224 the system reports the tick-by-tick evaluation status of the assertion attempt at each subexpression in the assertion expression. As previously mentioned, this kind of detail can be of great assistance in debugging the circuit design and/or the assertion.

In order to best understand the mechanism by which tick-by-tick subexpression evaluation status is reported by testing system 514, consider the following relatively simple assertion expression:

assert (b1##2 b2 ##[1:3] b3);     (Expression B)

This expression states that for every successful assertion attempt, b1 will be at a logic 1, b2 will be at a logic 1 on the second clock tick thereafter, and b3 will be at a logic 1 on one or more of the first, second or third clock tick after that (i.e. on one or more of the third, fourth or fifth clock tick after the assertion attempt time at which b1 was at a logic 1).

The following stimulus is assumed:

|    | tick |   |   |   |   |   |
|----|------|---|---|---|---|---|
|    | 0    | 1 | 2 | 3 | 4 | 5 |
| b1 | 1    | 1 | . | 1 | 1 | 1 |
| b2 | .    | 1 | 1 | 1 | . | 1 |
| b3 | 1    | . | . | . | . | 1 |

The evaluation of assertion Expression B against the above stimulus for attempt time 0 is found to pass, with the analysis reported as shown in FIG. 8. In these diagrams, each line in the analysis section indicates the tick-by-tick status of a corresponding node in the assertion tree, and at each tick, the following abbreviations are used:

'i' indicates an input tick to the current subexpression or operator. For an operator, 'i' indicates a tick on which any sequential or non-sequential activity of the operator begins. For a subexpression, 'i' indicates a tick on which subexpression evaluation begins. For the root subexpression, the input tick is the tick on which an attempt is initiated. That is, attempt initiation always causes 'i' on the line for the root subexpression, on the same clock tick as the attempt initiation. For subexpressions other than the root subexpression, the same is true: the parent operator provides an input tick to its suffix subexpression on specific ticks to cause the subexpression to initiate evaluation on those ticks. In essence these input ticks start a new "attempt" at the subexpression level, and might therefore also be called "sub-attempts". Certain operators may initiate multiple sub-attempts on the suffix subexpression.

'A' indicates that the current leaf node or operator is 'alive' on the indicated tick. For a leaf node, 'alive' means that it evaluates to logic 1 on the indicated tick. For an operator node, 'alive' means that the result of applying an input tick on the node operation is continuing to be active at the end of the node operation on the indicated tick.

'D' indicates that the current leaf node or operator is 'dead' on the indicated tick. For a leaf node, 'dead' means that it evaluates to logic 0 on the indicated tick. For an operator node, 'dead' means that the result of applying an input tick on the node operation has resulted in some leaf node in the subexpression tree 'dying' on the indicated tick.

'a' indicates a juxtaposition between an 'i' and an 'A'.

'd' indicates a juxtaposition between an 'i' and a 'D'.

'#' is used only for operators, and indicates that the current tick is ignored; no test of an operand subexpression is initiated on this tick.

'P' indicates that the attempt passes overall.

'F' indicates that the attempt fails overall.

Figure 9:
Figure 10:
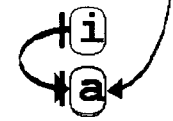

FIGS. 9–17 illustrate how the report of FIG. 8 is interpreted. Referring to FIG. 9, the 'A' on clock tick 0 in the "attempt" line indicates that the attempt being evaluated in this diagram is initiated on clock tick 0. Attempt initiation always causes an input tick on the same clock tick in the analysis section on the line for the root subexpression, s0. The line for s0 therefore shows an 'i' on clock tick 0.

The first subexpression of the root expression s0 is simply the primitive 'b1', which is tested on the same clock tick as attempt initiation. Thus referring to FIG. 10, it can be seen that b1 is in fact alive (evaluates to logic 1) on clock tick 0. And since clock tick 0 is also the input tick to the subexpression b1, the line for the subexpression b1 indicates 'a' on clock tick 0. As mentioned above, the abbreviation 'a' indicates the combination of 'i' (input tick) and 'A' (subexpression is alive).

The 'alive' status of subexpression b1 causes an input tick to the cycle delay operator '##2' on the same clock tick, so as shown in FIG. 11, the line for the operator '##2' indicates 'i' (input tick) on clock tick 0.

The cycle delay operator '##2' requires the assertion testing system to ignore the input tick and the first clock tick after the input tick, and come alive on the second tick after the input tick. Thus as shown further in FIG. 11, the line for operator '##2' indicates '#' (ignored tick) on clock tick 1 and 'A' (alive) on clock tick 2.

The next subexpression of the root assertion expression s0 is the primitive 'b2', which is tested on the same clock tick as its input tick. The input tick to this subexpression is caused by the '##2' operator being alive ('A') on tick 2, so tick 2 is also the input tick to subexpression 'b2'. Thus referring to FIG. 12, it can be seen that b2 is in fact alive (logic 1) on clock tick 2, and since clock tick 2 is also the input tick to the subexpression b2, the line for the subexpression b2 indicates 'a' on clock tick 2.

The cycle delay operator '##[1:3]' requires the assertion testing system to ignore the input tick and come alive on each of the first, second and third ticks after the input tick. Thus as shown in FIG. 13, the line for operator '##[1:3]' indicates 'i' (input tick) on clock tick 2 and 'A' (alive) on each of the next three clock ticks 3, 4 and 5. The 'A' on each of the next three clock ticks 3, 4 and 5 means the suffix subexpression, 'b3', will be tested on each of the clock ticks 3, 4 and 5.

FIG. 14 shows a 'd' on the line for subexpression b3, on clock tick 3, indicating both that clock tick 3 is an input tick and that b3 evaluated to logic 0 on tick 3. Similarly, FIG. 15 shows a 'd' on the line for subexpression b3, on clock tick 4, indicating both that clock tick 4 is an input tick and that b3 evaluated to logic 0 on tick 4. Since b3 is "dead" on clock ticks 3 and 4, the entire root expression s0 is also dead (evaluates to 0) on clock ticks 3 and 4, and this is reported on the line for s0 as 'D' codes on clock ticks 3 and 4.

Figure 17:
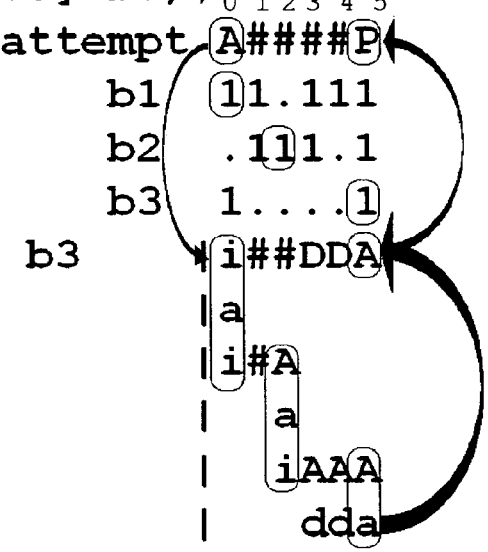

Since b3 is dead on ticks 3 and 4, it must be "alive" on clock tick 5 in order for the subexpression (and hence the overall assertion) to pass. This is shown in FIG. 16, which shows an 'a' on the line for subexpression b3, on clock tick 5, indicating both that clock tick 5 is an input tick and that b3 evaluated to logic 1 on tick 5. As shown in FIG. 17, the 'a' on tick 5 means the entire root expression s0 is alive on tick 5, as indicated by the 'A' on the line for expression s0. And since the root expression s0 is alive on tick 5, the assertion passes for the current attempt, as indicated by the 'P' on the "attempt" line in the stimulus section of the figure.

FIG. 18 illustrates the tick-by-tick analysis report produced by the assertion testing system 514 for a more complex example assertion, in order to better illustrate how such an analysis can assist in the debugging process. The assertion used in this example is Expression A above, illustrated in tree form in FIGS. 3 and 4. Expression A is broken down into the subexpressions shown in the tree of FIG. 3, and is analyzed at each node in the tree. It can be seen from the tree that the root and intermediate nodes break down the assertion statement into the following subexpressions:

s0=s1 ##1 b5 s1=s2[*3:5]

s2=s3 or s4 s3=b1 ##[2:5] b2 s4=b3 ##[0:4] b4

This makes all the following expressions equivalent:

((b1 ##[2:5] b2) or (b3 ##[0:4] b4))[*3:5] ##1 b5      1.

(s3 or s4)[*3:5] ##1 b5      2.

s2 [*3:5] ##1 b5      3.

s1 ##1 b5      4.

Verbally, the assertion statement requires either that signal b2 be alive on the second, third, fourth or fifth clock tick after b1 is alive, or that signal b4 be alive either zero, one, two, three or four clock ticks after b3 is alive, and that this disjunction to be true either three, four or five times in a row, with a single tick delay between each repetition, after which the signal b5 is required to be alive one clock tick later.

The report of FIG. 18 is divided into a stimulus section followed by an analysis section. Both the rows and columns have been numbered in FIG. 18 for easy reference. In line 11 in the stimulus section, it can be seen that an attempt begins on tick 00 and finally fails on tick 14. As in FIGS. 8–17, lines 12–16 of the stimulus section in FIG. 18 indicate the signal values for signals b1–b5 on each of the clock ticks.

The analysis section in FIG. 18 expands the root expression into its component subexpressions, including expanding the cycle repetition operator into its component sequential concatenations. Thus lines 31–36 report the history of s1 during the first repetition, lines 41–46 report the history of s1 during the second repetition, and lines 51–56 report the history of s1 during the third repetition, which fails. Since the third repetition of s1 fails, and the assertion requires s1 to pass for at least three consecutive repetitions, the entire assertion fails upon failure of the third repetition. Evaluation therefore terminates after the third repetition of s1.

In the first repetition, in line 31, it can be seen that s2 will be true only if either s3 or s4 are true. At line 32, it can be seen that in order for s3 to be true, b1 must be alive when the first repetition is initiated (at tick 00), and then b2 must be alive either two, three, four or five clock ticks later. In line 33, at tick 00, the 'a' on tick 00 indicates that b1 is in fact alive on that tick. On line 34, the concatenation operator is therefore initiated at tick 00, ignores tick 01, and is alive on each of ticks 02–05, which are the second through fifth ticks after the operator was initiated. On line 35, it can be seen that tests of b2 were in fact initiated on each of the alive ticks of the concatenation operator, and it was found that b2 was dead on clock ticks 02, 03 and 04 (as indicated by 'd' symbols), but was alive on clock tick 05 (as indicated by the 'a' symbol). Thus the subexpression s3 is true during the first repetition.

For subexpression s4, it can be seen that in order for s4 to be true, b3 first must be alive on the clock tick at which this first repetition is initiated. This is not true (see tick 00 in line 14). Therefore the concatenation operator in s4 is never initiated and never produces any alive ticks, and for that reason no tests of b4 are ever initiated. No tick-by-tick status information is shown in FIG. 18 for this first repetition for the concatenation operator or b4 because these lines would be blank. Overall, therefore, s4 cannot be true during this repetition.

Nevertheless, only one of s3 or s4 need be true in order for s2 to be true during this repetition, so since s3 was true, s2 is also true, as indicated by the alive symbol 'A' on line 31, tick 05.

The second repetition of s2 is initiated one clock tick after successful completion of the first repetition, according to the syntax rules. Since the first repetition completed successfully on clock tick 05, the second repetition is initiated on clock tick 06. This time s3 is immediately determined to be false, since b1 is dead on clock tick 06. S3 is not expanded in FIG. 18 for the second repetition since it would contain all blank entries. However, s4 may yet pass because b3 is alive in clock tick 06. B3's alive status is indicated on line 44 by an 'a' on clock tick 06. B3 alive on clock tick 06 initiates the cycle delay operator '##[0:4]', which as mentioned, requires b4 to be alive zero, one, two, three or four clock ticks after b3 was alive. Thus on line 45 it can be seen at the operator is alive on each of clock ticks 06 through 10. Referring to line 46, it can be seen that tests of the suffix operand b4 were in fact initiated on each of the alive ticks of the cycle delay operator. B4 tested dead on clock ticks 06 and 07, but alive on clock tick 08. S4 therefore passes on clock tick 08, meaning the second repetition of s2 also passes on clock tick 08. The report of FIG. 18 continues the analysis of the second repetition into clock ticks 09 and 10, to further assist any debug analysis. In another embodiment this information may be omitted.

The third repetition of s2 is initiated one clock tick after successful completion of the second repetition, meaning the third repetition is initiated on clock tick 09. As with the first repetition, in the third repetition s4 is immediately determined to be false because b3 is not alive on clock tick 09. Line 56 therefore shows a 'd' on clock tick 09. S3 might yet pass, since b1 is alive on clock tick 09 as reported by the 'a' symbol on line 53. The aliveness of b1 on clock tick 09 initiates the '##[2:5]' operator on line 54, which has previously mentioned, initiates tests of the suffix operand b2 on each of the clock ticks two through five clock ticks later (on clock ticks 11–14). B2 is, however, dead on each of those clock ticks, as reported by the 'd's in each of those columns on line 55. Since b2 was dead during all of the required clock ticks, s3 fails (as indicated by the absence of any 'A' in line 52 on any of the clock ticks 11–14). Since s3 and s4 both fail, the third repetition of s2 also must fail (as indicated by the absence of any 'A' in line 51 on any of the clock ticks 11–14). Finally, since the third repetition of s2 failed, s1, which requires a minimum of three repetitions of s2, must also fail. This can be seen by the absence of any 'A's on line 22. S0 must also then fail because of the failure of s1, and this, too, is indicated by the absence of any 'A's on line 21. Since the root expression s0 failed to come alive at any time during the series of clock ticks on which any of the subexpressions were alive, the assertion attempt beginning on clock tick 00 failed overall on clock tick 14. This indicated by the 'F' in line 11 on clock tick 14.

It can be seen that the tick-by-tick, node-by-node analysis report in FIG. 18 provides far more information to the designer than simply that the attempt that began at tick 00 failed at tick 14. It also lets the designer know, among other things, that:

It was the repetition subexpression s1 at which the failure occurred, not the final suffix operand b5;

Within the repetition subexpression s1, it was not the first or second repetition that cause the failure, but the third repetition;

The first repetition passed because s3, not s4, was true, and s3 was true because b2 was alive on the fifth tick after b1 was alive, not the second through fourth tick after b1 was alive;

The second repetition passed because s4, not s3, was true, and s4 was true because b4 was alive on the second clock tick, not the zero'th, first, third or fourth clock tick, after initiation of the second repetition.

Within the third repetition, s4 failed immediately but s3 had a possibility of passing. S3 failed, however, not because of the absence of b1, but because b2 did not come alive during any of the required clock ticks after b1 tested alive.

All this information provides much-needed assistance to the designer in the debugging of the logic circuit and/or the assertion expression.

It will be apparent to the reader that the report format of FIG. 18 is only one of numerous reporting formats that might be provided in various embodiment. For example, it is preferred that the analysis section of a report such as that of FIG. 18 be interactive, allowing the user to expand and contract the details of the various subexpressions and repetitions through a point-and-click behavior. Much more sophisticated graphical user interfaces can be devised as well. But regardless of the interface, the reporting of either tick-by-tick status information at intermediate nodes in the expression tree, and/or the reporting of merely pass/fail/indeterminate status information at intermediate nodes in the expression tree, provides great assistance to designers in the debugging their logic circuits and/or the assertion expressions.

Example Implementation

Set forth in the Appendix hereto is Python-like pseudocode describing an example set of algorithms implementing the above-described functions. Note that the # symbol in this pseudocode indicates that a comment follows until the end of the line. In the example, it is assumed that the assertion statements are coded according to the System Verilog syntax, but other implementations can be developed for statements coded according to the specifications of other assertion-based languages.

The algorithm assumes that the sequential assertion expression to be evaluated is rendered unambiguously into a tree structure of nodes, such as that shown in FIG. 4. The only non-temporal subexpressions in the assertion expression are Boolean operands. Thus the tree nodes are either temporal operator nodes, denoted by s0,s1, . . . , or boolean operand nodes, denoted by b0,b1, . . .

The temporal operators defined are-the cycle delay (## [n:m]), repetition (*[n:m]), or, and, intersect, throughout, implies (|–>), and implies not (|–>not). Other temporal operators can also be defined as simple extensions of the algorithm set forth in the Appendix. The algorithm also assumes a fixed finite window of clock ticks within which the assertion statement is to be evaluated, and all boolean operand values are given per clock tick. The implication operator, along with the not operator, are only allowed at the top level of the expression tree. The cycle delay operator (##[n:m]), and the repetition operator (* [n:m]) can be open-ended. That is, m can be infinite and specified with a $. For example, '##[3:$]' means from 3 to infinite cycles. The range information [m:n] in the cycle delay and repetition temporal operator nodes are held in (base,offset) form. The offset has the value −1 to indicate infinity ($ in System Verilog).

As mentioned, the semantics of a concurrent sequential assertion state that an assertion attempt is initiated upon each and every clock tick, and that all must independently pass. The algorithm in the Appendix evaluates an assertion for one attempt only, and that the attempt starts on the first clock tick within the fixed time window. Generalization to all attempts within the time window will be recognized as a trivial extension.

An important abstract data structure for the algorithm is a 'set' class that holds some arbitrary number of ticks. In the algorithm, initialization of a set is indicated with { }. An important method on a set object is the update function: t.update(o) is essentially a set union operation between the t and o objects, i.e. t=t union o.

Each expression input boolean operand has an associated stimulus waveform that is assumed to be given to the algorithm in the form of a set of ticks for the clocks at which the input is at a logic 1. The clock ticks held in the sets are simple integer numbers 1,2,3, . . . , which map directly onto the actual clock ticks. That is, the simulation times at which the actual clock ticks occur are abstracted into the sequence 1,2,3 . . . . A logic 0 on a given clock tick is indicated in the set by the absence of the given clock tick in the set.

In general overview, the main entry point of the algorithm is the method getPFB, and is a function call on the root node of the expression tree. It is given the initial attempt clock tick (normally 1 in this algorithm), and returns the triple vector P,F,aB that indicates whether the attempt passes, fails or goes beyond the end of the fixed time window. In the pseudocode, all function calls are calls to methods of the expression tree node objects, where the variable 'self' refers to the node object.

The variable 'lastTick' refers to the last clock tick in the time window.

The triple vector As,maxL,B refers to the temporal expression results of the algorithm, and the triple vector P,F,aB refers to the main property results. The methods ALBtoPFB and PFBtoALB convert between the temporal triple vector As,maxL,B and the logical property triple vector P,F,aB. In these vectors:

'As' is the set of alive ticks.

'maxL' is the set of dead ticks, such that its maximum clock tick may indicate the clock tick on which an attempt fails.

'B' is empty or contains lastTick to indicate that activity goes beyond the end of the time window.

'P' is None, or indicates the clock tick on which the attempt passes.

'F' is None, or indicates the clock tick on which the attempt fails.

'aB' is None, or is a flag indicating that the attempt goes beyond the end of the time window and the result is indeterminate.

The nodes of the tree structure are each separate instances of objects in an object class hierarchy. The class hierarchy has a generic node class, and descended from that are separate subclasses specific to the various types of temporal operators. Each node class has, among other things, a respEvalSet method, which is inherited from the generic node class, and a respEvalTick method, which is specific to the particular subclass. The method respEvalTick is related to respEvalSet, but this function is specialized for each type of temporal operator. The method respEvalSet is the main function for evaluating a temporal operator, and is the general method called for all types of nodes. This method takes a set of alive ticks as input, and calls the respEvalTick method of current node for each individual one of the alive ticks. Essentially the respEvalSet method initiates a separate assertion sub-attempt on the node expression, in recursive fashion through the tree, for each tick in the input set of alive ticks. Each call to the respEvalTick method returns a set of 0 or more alive ticks generated in response to the assertion sub-attempt, and returns this set (as well as a combined set of dead ticks and the 'beyond' flag) in the form of the triple vector As,maxL,B. The respEvalSet method combines all of the alive sets returned from the respEvalTick calls, with the Union function, and also combines the dead tick sets and the beyond flags. The combined information is returned by respEvalSet also as the triple vector As,maxL,B. Each time a triple vector As,maxL,B is returned to a caller, it is first filtered through the method finalALB, which is a simple cleaning and checking function for optimizing and asserting the correctness of the results.

The respEvalTick method of each node knows, based on the operator of the node and the input tick provided by the calling respEvalSet method, on which tick(s) each of its child nodes are to initiate further sub-attempts. For example, for non-temporal operators such as 'or', the respEvalTick method knows to initiate subattempts to each of its child subexpressions only on the same tick that was provided as the input tick from the calling respEvalSet method. For a temporal operator such as a temporal cycle operator (e.g. '##[m:n]'), the respEvalTick method knows to initiate one subattempt on the prefix subexpression, and based on the alive tick set returned by the prefix subexpression, generate a new set of alive ticks on which to initiate subattempts on the suffix subexpression.

But the respEvalTick methods do not initiate the assertion attempts on child subexpressions directly. Instead, the respEvalTick method merely calls the respEvalSet method of the child subexpression's node object, specifying the set of alive ticks for which assertion sub-attempts are to be initiated. The task of breaking the set up into individual assertion sub-attempts is left to the respEvalSet method, which as mentioned above, calls the respEvalTick method of the then-current node (now the child node) for each one of the alive ticks individually and combines the alive tick sets returned therefrom.

Nor in the Appendix embodiment do the respEvalTick methods generate, in dependence upon the operator and the input tick, the set of alive ticks on which particular subexpressions are to be stimulated. Instead, at least for certain operator types, an additional dummy child node is instantiated in the tree structure to perform this function. In FIG. 4, these are the nodes 410, 412 and 414. The use of a dummy child node to perform this function preserves a symmetry in the Appendix embodiment that each node contains a method (respEvalSet) that performs a transformation from an input set of alive ticks to a new set of alive ticks. For a subexpression node, the transformation is accomplished in accordance with the subexpression (including recursive calls to the same method in further child nodes). For an operator node, the transformation is accomplished purely in dependence upon the operator. For example, if the operator is the cycle delay operator '##[m:n]', and the input alive set to this operator contains only one tick, at clock tick p, then the respEvalSet method of that operator node will transform that input alive set into an output alive set containing clock ticks p+m, p+m+1, ..., p+n. If the input alive set contains two clock ticks, at p and q, then the respEvalSet method of that operator node will transform that input alive set into an output alive set containing the union of the clock tick sets {p+m, p+m+1, ..., p+n} and {q+m, q+m+1, ..., and q+n}. It will be appreciated that different embodiment, whatever method performs the equivalent function as respEvalTick may instead determine for itself, based on the operator and one or more input ticks, the ticks on which to initiate sub-assertions into one or more subexpressions.

For leaf nodes, the respEvalTick method does not need to initiate assertion attempts into any other node. Instead, since the leaf node represents a pure boolean, the respEvalTick method simply retrieves the referenced signal value from the stimulus on that clock tick and returns either a null alive tick set (if the signal value was 'false'), or an alive tick set containing only the input clock tick (if the signal value was 'true'). In a slightly more general implementation, leaf nodes are not limited to pure references to input signal variables, but can contain any purely combinational function of constants and the input signal variables. In such an implementation, the respEvalTick method evaluates the combinational function on the specified clock tick and returns either a null alive tick set (if the function evaluated to 'false'), or an alive tick set containing only the input clock tick (if the function evaluated to 'true').

As mentioned, the respEvalSet method performs the functions of breaking up a set of alive ticks into individual ticks on which to initiate sub-attempts, and combining the alive tick sets returned from the subattempts. Encapsulating those functions into a method separate from the respEvalTick method provides coding efficiency and modularity, and for that reason all assertion sub-attempts are made through respEvalSet rather than directly—even if the stimulating set of alive ticks contains only one tick. In addition, this arrangement also permits the algorithm to operate more efficiently, by caching intermediate results. That is, for an assertion sub-attempt initiated on a given node on a given tick, the transformation (at least for System Verilog 3.1 assertion expressions) by definition will always return the same set of alive ticks. This is true both for nodes representing subexpressions as well as for dummy nodes representing operators. Advantageously, therefore, the respEvalSet function caches these results as they are returned and stores them in association with the node, and identified by the sub-attempt initiation tick. After the respEvalSet method breaks up an input set of alive ticks into individual ticks, the method checks its cache before initiating the individual tick subattempts. For ticks in the input alive set for which the result alive set is already cached in the current node, the respEvalSet method simply retrieves the cached result and does not initiate the tick subattempt. Efficiency gains can be substantial, especially for subexpression nodes which form the root of large subtrees, and for subexpression nodes with a 'repetition' temporal operator.

The caching is performed in the Appendix embodiment at the node and subattempt-tick level, and therefore it is convenient to perform the caching functions as part of a method that initiates subattempts on the node for individual subattempt ticks. Although it might be less advantageous, however, another embodiment might perform caching at a different level, such as at the node and subattempt-tick-set level. In that case the caching functions might be performed elsewhere.

FIGS. 19–24 are flowcharts describing a simplification of the algorithm set forth in more detail in the Appendix. In the event of any discrepancies between the two descriptions, they should be considered as different embodiments pointing out a few of the different ways in which aspects of the invention can be implemented.

Figure 19:
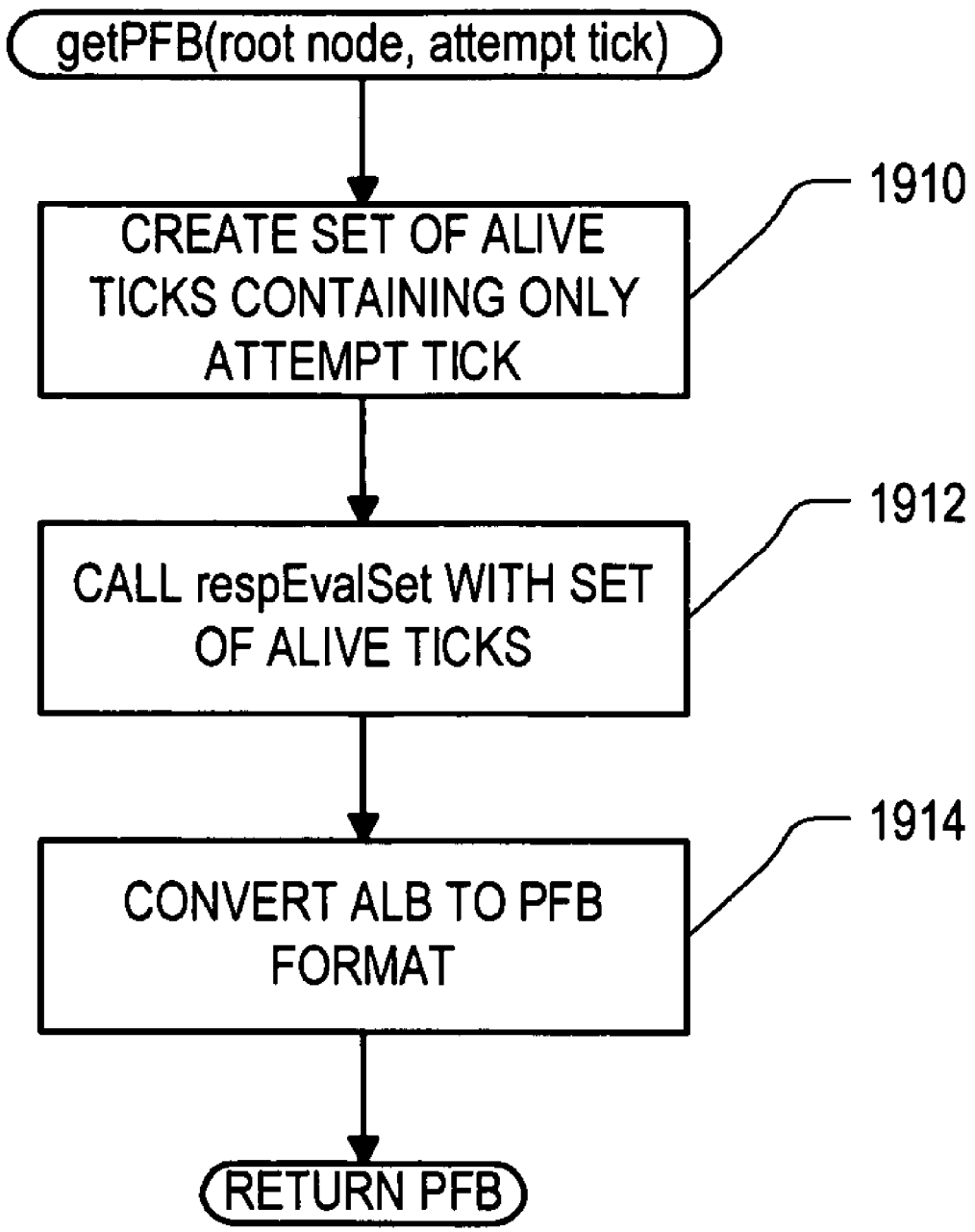
FIGS. 19–24 are flowcharts collectively describing an assertion evaluation algorithm embodiment.

Referring to FIG. 19, the main entry point for the algorithm is the getPFB method of the root node. The getPFB method is called, for example as part of step 224 (FIG. 2), with a single 'attempt tick' as input. In step 1910, the getPFB method first creates a set of alive ticks containing only the input attempt tick. In step 1912 the method calls the respEvalSet method of the current (root) node with this set of alive ticks, and the respEvalSet method returns temporal expression results in the form of an As,maxL,B vector. In step 1914, the getPFB method converts the temporal expression results into main property results in the form of the triple vector P,F,aB.

Figure 20:
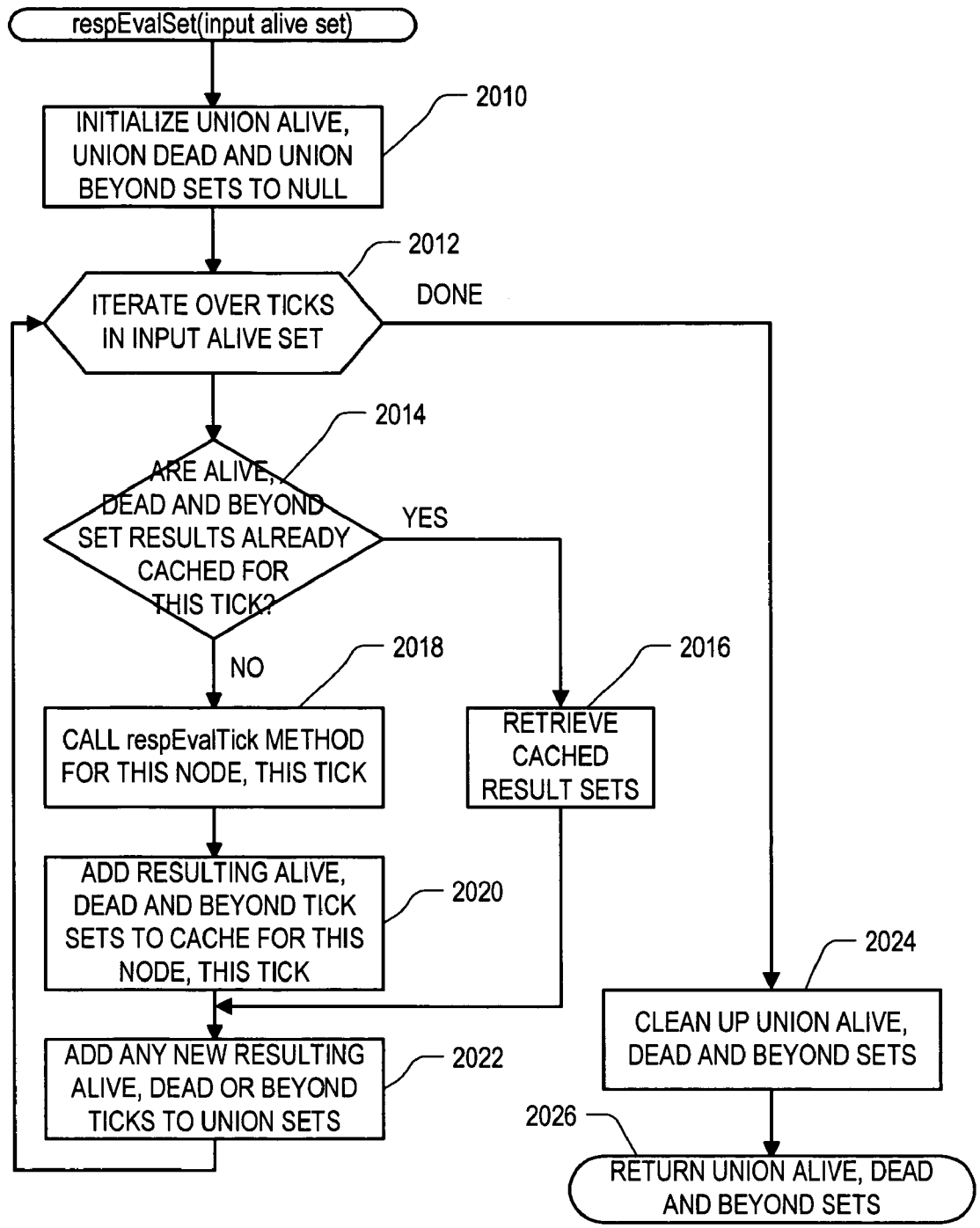

FIG. 20 is a flowchart of the respEvalSet method. As mentioned, since this method is defined in the generic node object class and inherited by each of the node object subclasses, all node objects point to the same respEvalSet method. Each node object instantiation, however, maintains its own data store for the method.

In step 2010, the respEvalSet routine first initializes a working As,maxL,B triple called uAs,umaxL,uB. This triple is sometimes referred to herein as a "union" triple because is usually used to consolidate the As,maxL,B results from more than one call source.

In step 2012, the respEvalSet routine begins an iteration over all the ticks in the input alive set. In step 2014, the routine determines whether it already has cached results for the current tick. If so, then in step 2016, it simply retrieves the cached results set. If not, then in step 2018 the respEvalSet method calls the respEvalTick method for the current node, passing the current tick to the method. The respEvalTick method returns with an As,maxL,B triple, and in step 2020 the respEvalSet method caches these results in conjunction with the current known, identified with the tick that had been passed to the respEvalTick method in step 2018. In step 2022, the As,maxL,B triple for the current tick, whether obtained from a call to the respEvalTick a method in step 2018 or retrieved from cache in step 2016, is added to the union triple uAs,umaxL,uB. The respEvalSet method then returns to step 2012 to obtain results for the next tick in the input alive set. Note that when respEvalSet is originally called from step 1912 of the getPFB method (FIG. 19), only a single iteration occurs in step 2012 since the input alive set contains only the single original attempt tick. When the iteration completes for all elements of the input alive set, then in step 2024, the union triple uAs,umaxL,uB is cleaned up to place it into a consistent format, and in step 2026, it is returned as As,maxL,B to the caller.

As mentioned, the respEvalTick method instantiated for each node is specific to the main operator type of the node's expression or subexpression. The flowcharts of FIGS. 21–24 describe the respEvalTick methods instantiated for several different ones of the supported operators.

Figure 21:
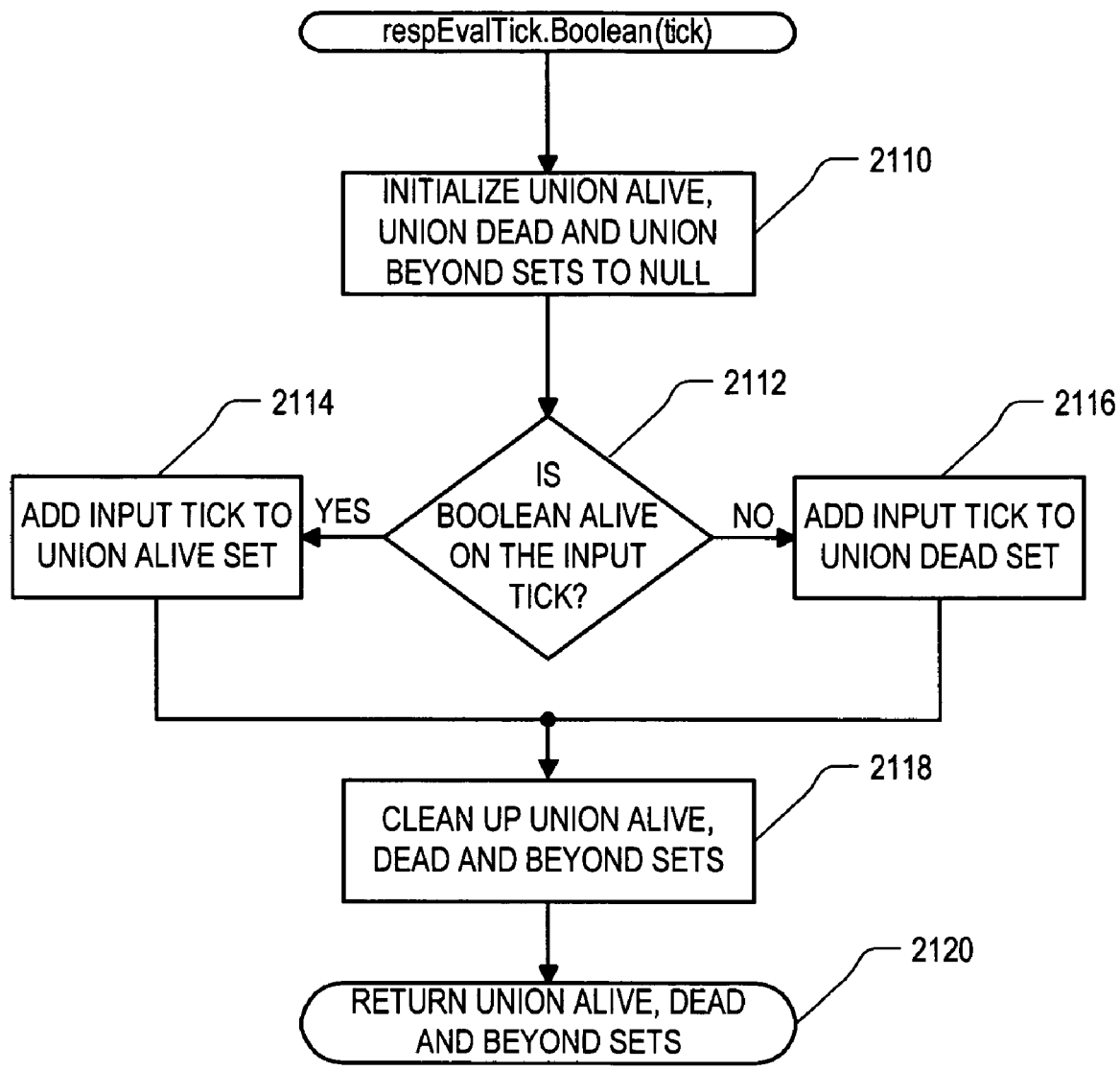

FIG. 21 is a flowchart of the respEvalTick method for simple Boolean expression nodes such as nodes 316, 324, 326, 328 and 330 in FIG. 4. The expressions of these nodes simply refer to an individual binary variable in the input stimulus. In step 2110, the respEvalTick a routine first initializes a temporary uAs,umaxL,uB triple to null. For consistency of coding, this step is performed at the beginning of many of the respEvalTick methods, even if not needed. In step 2112, the respEvalTick method checks whether the specified Boolean variable is alive (logic one) on the input tick that was provided to the method. If so, then the respEvalTick method adds the input tick to the union alive set uAs (step 2114). If not, then in step 2116, it adds the input tick to the union dead set uB instead. In either case, in step 2118 the respEvalTick method cleans up the union triple uAs,umaxL,uB and, in step 2120, returned it as As,maxL,B to the caller. As with the step 2110, steps 2118 and 2120 are performed in many of the respEvalTick methods, just before returning, even if not needed.

As used herein, a given signal, event or value is "responsive" to a predecessor signal, event or value if the predecessor signal, event or value influenced the given signal, event or value. If there is an intervening processing element, step or time period, the given signal, event or value can still be "responsive" to the predecessor signal, event or value. If the intervening processing element or step combines more than one signal, event or value, the signal output of the processing element or step is considered "responsive" to each of the signal, event or value inputs. If the given signal, event or value is the same as the predecessor signal, event or value, this is merely a degenerate case in which the given signal, event or value is still considered to be "responsive" to the predecessor signal, event or value. "Dependency" of a given signal, event or value upon another signal, event or value is defined similarly. For example, therefore, it can be said that the As,maxL,B triple returned to the caller in step 2120 identifies on which if any ticks the boolean expression of the current node is alive "in response to", or "in dependence upon", the input tick that was provided to the respEvalTick method of FIG. 21.

Also, the As,maxL,B triple is said to "identify" on which if any ticks the expression is alive. As used herein, the "identification" of an item of information does not necessarily require the direct specification of that item of information. Information can be "identified" in a field by simply referring to the actual information through one or more layers of indirection, or by identifying one or more items of different information which are together sufficient to determine the actual item of information. In addition, the term "indicate" is used herein to mean the same as "identify". Thus, for example, the As,maxL,B triple "identifies" or "indicates" a set of alive ticks in the embodiment of FIG. 21 by containing (among other things) a set of numerical designations of the ticks (if any) on which the expression is alive. In another embodiment, the same information can be "indicated" or "identified" by another set containing numerical designations of ticks on which the expression is not alive. In yet another embodiment, the same information can be "indicated" or "identified" by a vector containing a Boolean entry for each and every tick in the window, the entry being a logic one if the expression is alive on that tick, or a logic zero if the expression is dead on the tick. Numerous other ways of "identifying" or "indicated" the set of alive ticks will be apparent to the reader.

Figure 22:
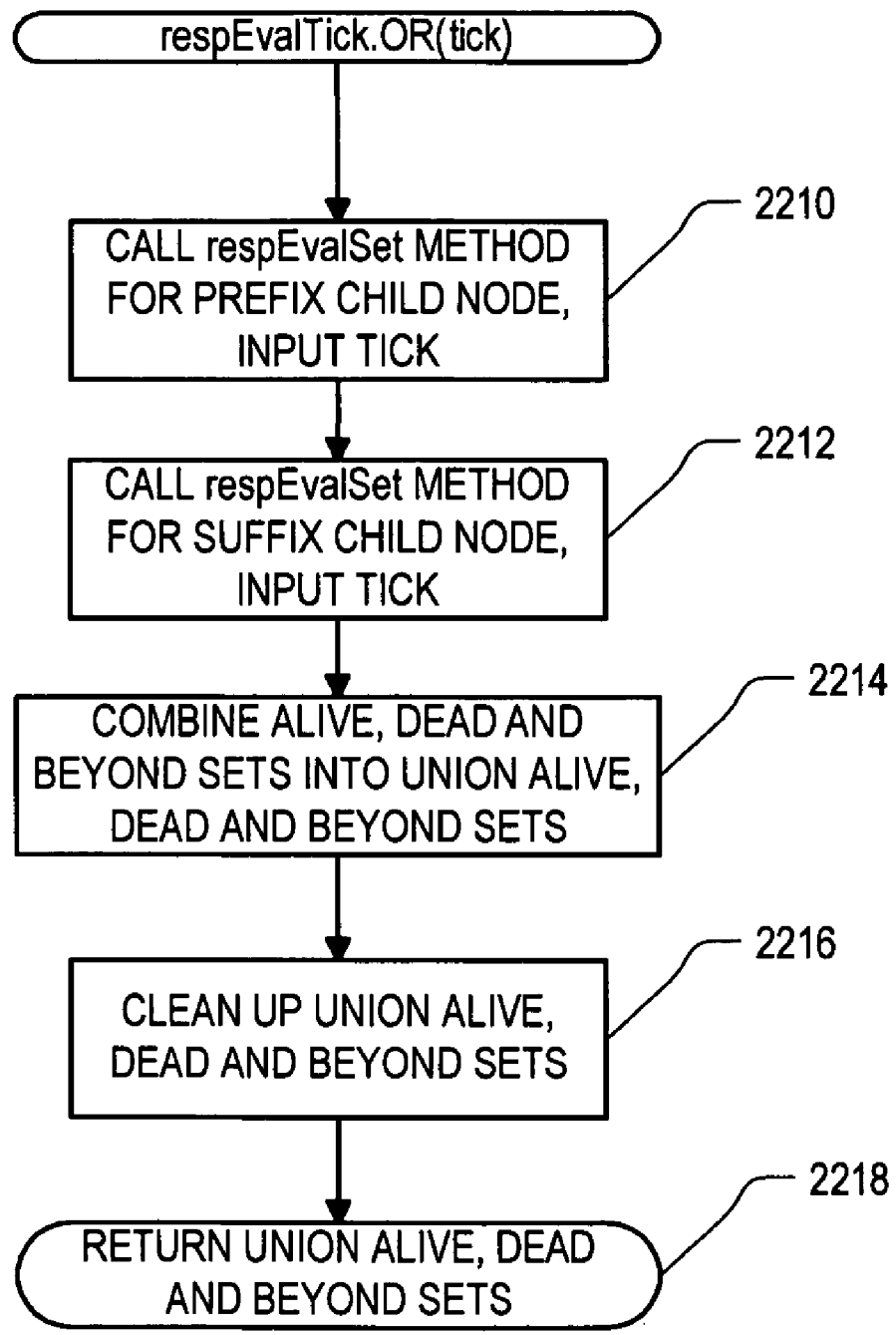

FIG. 22 is a flowchart of the respEvalTick method instantiated for a simple "or" operator. The evaluation of the "or" operator on an input tick simply involves recursively obtaining the set of alive ticks from each of the two operands, and then taking the union of the two sets. Thus in step 2210, the respEvalTick method calls the respEvalSet method for the prefix child node, specifying the input tick that was provided to the respEvalTick method. In step 2212, the respEvalTick method then calls the respEvalSet method for the suffix child node, again specifying the input tick that was provided to the respEvalTick method. In step 2214 the As,maxL,B triples that were returned in steps 2210 and 2212 are combined into a union triple uAs,umaxL,uB, and in step 2216 and 2218 the union triple uAs,umaxL,uB is cleaned up and returned as As,maxL,B to the caller.

Note that in step 2210 and 2212, the respEvalTick method of FIG. 22 has only a single input tick with which to call the respEvalSet methods for the prefix and suffix child nodes. Syntactically, therefore, in a different embodiment the respEvalTick method of FIG. 22 could instead have called the respEvalTick methods of the prefix and suffix child nodes directly. The convention of the present embodiment, however, is to obtain the alive tick set from child nodes only through the respEvalSet methods, even if the input alive set passed to the respEvalSet method will never contain more than one input tick. This convention permits the algorithm to take advantage of the caching facility of the respEvalSet method. Note further that the As,maxL,B triple returned to the caller in step 2218 is responsive to (dependent upon) all three of the following: the set of alive ticks returned in step 2210, the set of alive ticks returned in step 2212, and the input tick that was provided to the respEvalTick method of FIG. 22 when it was called.

Figure 23:
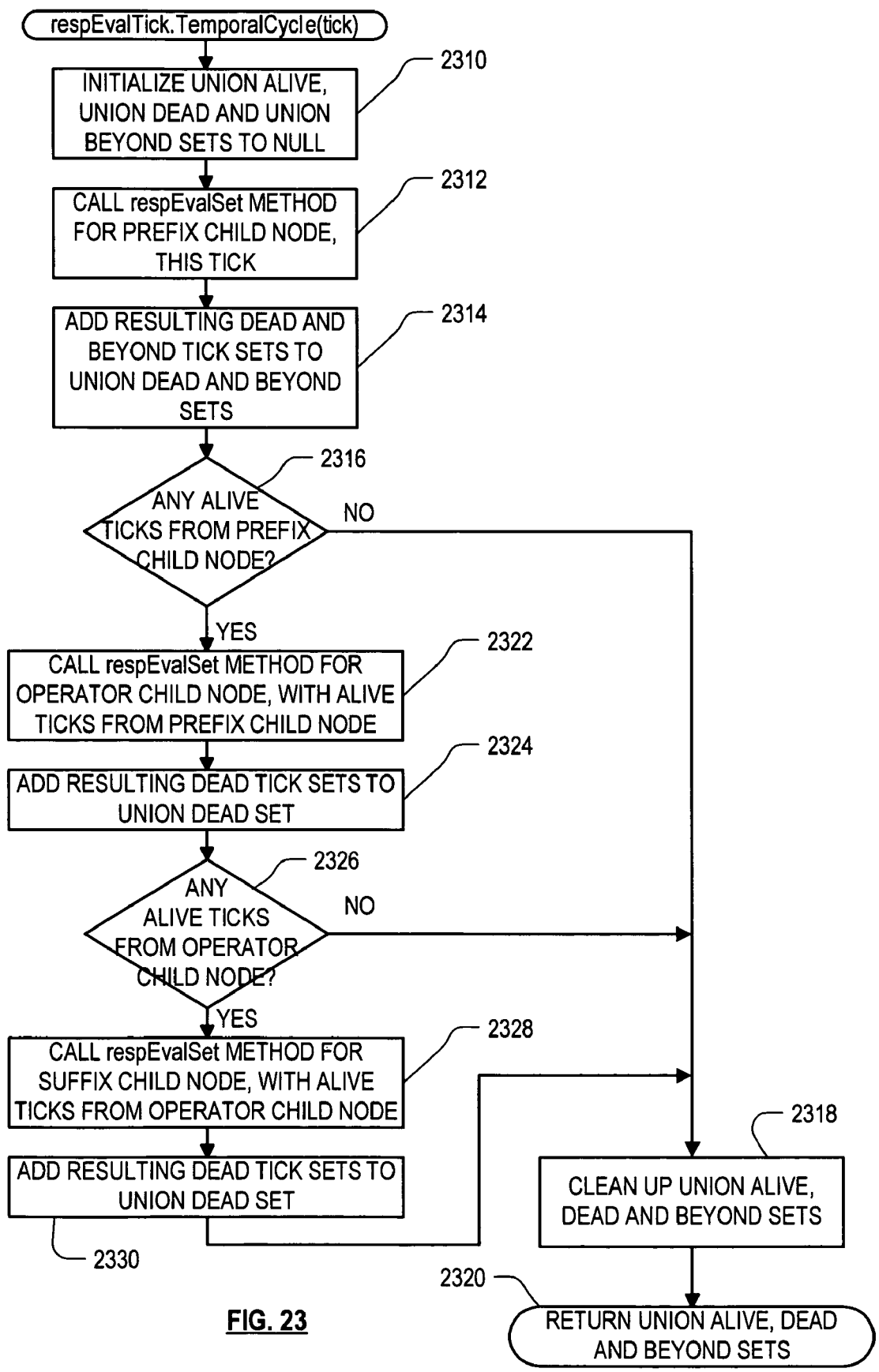

FIG. 23 is a flowchart of the respEvalTick method instantiated for a temporal cycle operator (the concatenation operator), for example at nodes 320 and 322 of FIG. 4. It will be seen that the actual cycle delay alive tick transformation occurs through a call to the respEvalSet method of dummy child nodes 410 and 412, rather than being determined directly in nodes 320 and 322. Referring to FIG. 23, in step 2310, the respEvalTick routine of FIG. 23 first initializes a temporary uAs,umaxL,uB triple to null. In step 2312, the respEvalTick method calls the respEvalSet method for the prefix child node, specifying only the current tick. In the tree of FIG. 4, this would be the respEvalSet method of node 324. Again note that the present embodiment obtains alive ticks from a child node using respEvalSet, rather than respEvalTick directly. In step 2314, the set of dead ticks and the beyond flag from the As,maxL,B triple returned from the prefix child node, are added to the union uAs,umaxL,uB triple.

Because of the function of the concatenation operator, it will be appreciated that if the prefix subexpression returns with no alive ticks, then the expression of the current node is also dead on the current tick and no further evaluation of the expression of the current node is required. Therefore, in step 2316, the respEvalTick method of FIG. 23 determines whether any alive ticks were returned from the prefix child node. If not, then in steps 2318 and 2320, the union triple uAs,umaxL,uB is cleaned up and returned as As,maxL,B to the caller. The alive set As in this triple is null.

If the triple returned from the prefix child node did contain at least one alive tick, then it is necessary to transform this set of alive ticks into a new set of alive ticks at which the suffix subexpression is to be tested. The transformation is governed by the specifics of the cycle delay operator, and is accomplished at step 2322 in the embodiment of FIG. 23 by calling the respEvalSet method for the operator dummy child node (nodes 410 or 412 in FIG. 4) with the set of alive ticks that had been returned from the prefix child node in step 2312. The respEvalTick method called by the respEvalSet method of the operator dummy child node is described below with respect to FIG. 24, but basically, for an operator of the form '##[M:N]', each tick in the alive tick set returned from the prefix child node will cause the respEvalTick method to return a set containing alive ticks at each tick from M to N, inclusive. The respEvalSet method of the operator dummy child node will then return the union of all of the alive tick sets returned from its calls to respEvalTick.

At step 2324 in FIG. 23, any dead ticks returned from the method call of step 2322 are added to the union dead tick set umaxL, and in step 2326, it is determined whether the alive tick set returned from the operator child node in step 2322 is null. If so, then again, the expression of the current node is also dead on the current tick and no further evaluation of the expression of the current node is required. The respEvalTick method therefore skips to step 2318 and 2320 as previously described.

If the triple returned from the operator child node in step 2322 does contain alive ticks, then it is now necessary to test the suffix subexpression at each of such alive ticks in order to determine whether the expression of the current node as a whole passes. In step 2328, therefore, the respEvalTick method of FIG. 23 calls the respEvalSet method for the suffix child node (node 320 64 330 in FIG. 4) with the alive ticks that had been returned from the operator child node in step 2322. Any dead ticks in the dead tick set returned from the suffix child node are then added to the union dead tick set umaxL in step 2330, and the alive, dead and beyond the sets are returned to the caller in steps 2318 and 2320 as the tick-by-tick status of the expression of the current node. In step 2318, the alive tick set returned as As in the As,maxL,B triple returned to the caller is the same as the alive tick set As that was returned by the suffix child node in step 2328. It can be seen that this tick set is "responsive" to, among other things, all four of the following: the set of alive ticks returned from the prefix child node in step 2312, the set of alive ticks returned from the operator dummy child node in step 2322, the set of alive ticks returned from the suffix child node in step 2328, and the input tick that was provided to the respEvalTick method of FIG. 23 when it was called.

Figure 24:
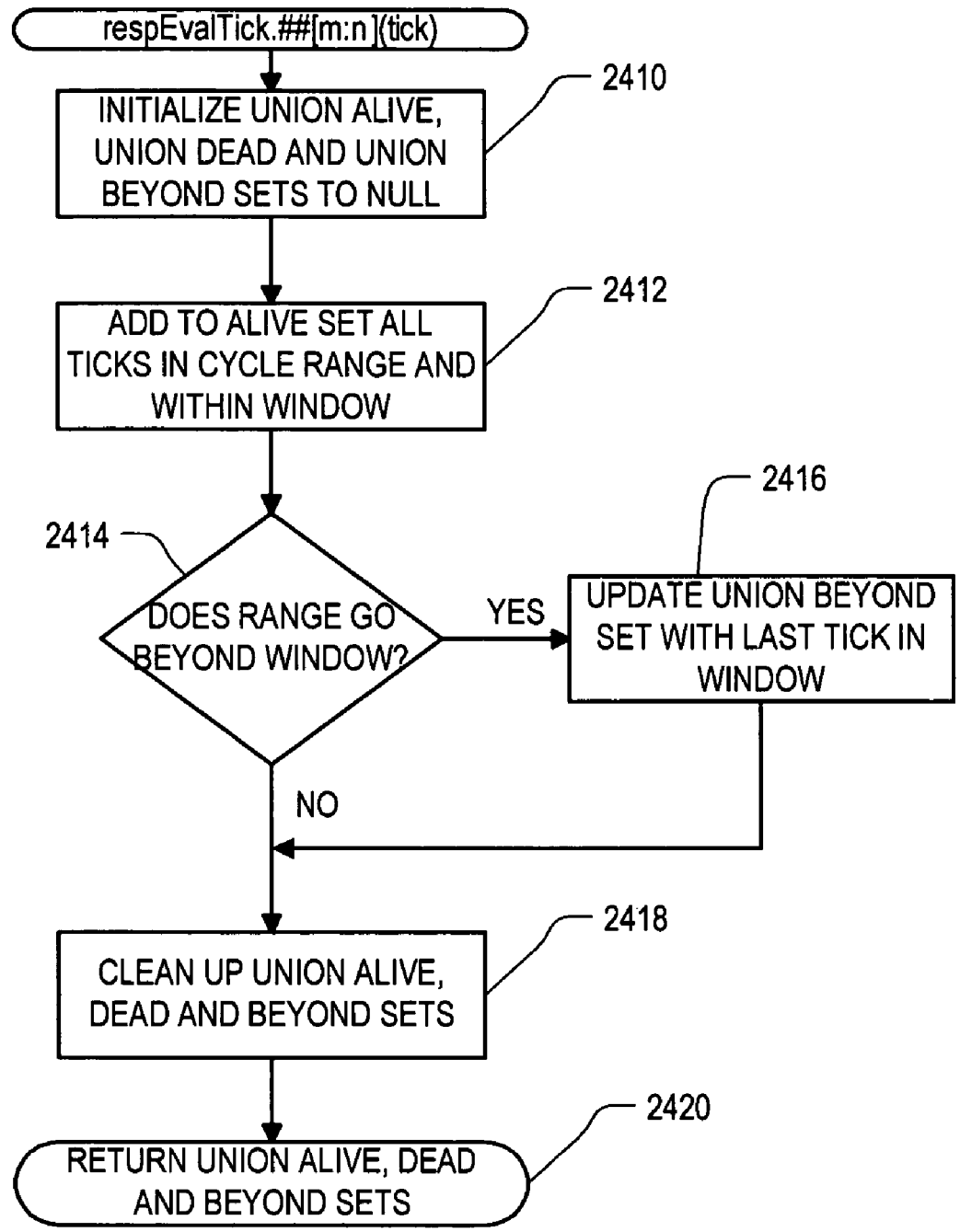

FIG. 24 is a flowchart of the respEvalTick method instantiated for a dummy child node (such as node 410 or 412 of FIG. 4) of a temporal cycle node. In step 2410, the respEvalTick routine of FIG. 24 first initializes a temporary uAs,umaxL,uB triple to null. In step 2412, it adds to the union alive set uAs all of the ticks that are within the evaluation window and which are within the cycle range defined by the operator specifics. For example, if the operator of the current node is expressed in the form '##[m:n]', and the input alive tick provided to the respEvalTick routine of FIG. 24 identifies clock tick p, then step 2412 will add to the union alive set all of the ticks p+m, p+m+1, . . . , p+n. In step 2414 and 2416, is determined whether the cycle range extends beyond the end of the evaluation window, and if so, the union beyond set uB is updated by the last tick of the evaluation window. In step 2418 and 2420, the union-triple uAs,umaxL,uB is cleaned up and returned as As,maxL,B to the caller.

In addition to the respEvalTick methods instantiated for Boolean, 'or', and temporal cycle operators, the Appendix sets forth pseudocode for the respEvalTick methods that would be instantiated for repetition, 'and', 'throughout', and 'overlapped implies' operators as well. It will be apparent to the reader how to develop appropriate respEvalTick methods for implementing other operators as well, whether they be defined in the System Verilog assertion language or in some other assertion language.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. For example, the logic level considered "alive" in another embodiment might be logic level 0 rather than 1 as in the embodiments above. As another example, whereas the embodiments described above mostly evaluate only one assertion expression at a time, it will be appreciated that they can be modified to evaluate multiple assertion expressions instead. Either an outer loop can be defined, for evaluating each assertion expression in its entirety for all attempts before going on to the next assertion expression, or an inner loop can be defined, beginning all assertion expressions at each attempt time within the loop. Or some other combination of serial and parallel evaluation can be implemented. The multiple assertion expression evaluations can occur on one or several process threads in one processor or even spread over more than one processor operating in parallel, all as will be apparent to the reader. In addition, and without limitation, any and all variations described, suggested or incorporated by reference in the Background section of this patent application are specifically incorporated by reference into the description herein of embodiments of the invention. The embodiments described herein were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

APPENDIX

Algorithm Description Pseudocode
Copyright (c) 2004 Synopsys, Inc.

```
#Main entry point to algorithm (normally applied to root node)
   def getPFB(self, attemptTick):
      As,maxL,B = self.respEvalSet({attemptTick})
      P,F,aB = self.ALBtoPFB(As,maxL,B)
      return P,F,aB
#Convert from As,maxL,B to P,F,aB
   def ALBtoPFB(self, As,maxL,B):
      As,maxL,B, ignore = self.finalALB(As,maxL,B,None)
      P,F,aB = None,None,0
      if As.nonEmpty( ):
         P = As.min( )
      elif B.nonEmpty( ):
         aB = self.lastTick
      else:
         F = maxL.max( )
      self.checkPFB(P,F,aB)
      return P,F,aB
#Convert from P,F,aB to As,maxL,B
   def PFBtoALB(self, P,F,aB):
      self.checkPFB(P,F,aB)
      As,maxL,B = ESet( ),ESet( ),ESet( )
      if P:
         As.update(P)
      elif aB:
         B.update(aB)
      else:
         maxL.update(F)
      return As,maxL,B
#Logic not of the PFB vector
   def notPFB(self, P, F, aB):
      return F,P,aB
#general tree node evaluation given a set of input ticks
   def respEvalSet(self, iAs):
      #uAs,umaxL,uB maintains the union of each for loop iteration result
      uAs,umaxL,uB = { },{ },{ } #initialize to empty sets
      for tick in iAs.ticks: #iterate over ticks in set iAs
         if not tick in self.ALBs: #is tick cached?
            self.ALBs[tick] = self.respEvalTick(tick)
         As,maxL,B = self.ALBs[tick] #read cached results
         uAs.update(As)
         umaxL.update(maxL)
         uB.update(B)
      return self.finalALB(uAs,umaxL,uB)
#specific tree node tick evaluation of a boolean operand
```

APPENDIX-continued

Algorithm Description Pseudocode
Copyright (c) 2004 Synopsys, Inc.

```
   def respEvalTick(self, tick):
      uAs,umaxL,uB = { },{ },{ } #initialize to empty sets
      if tick in self.stim:
         uAs.update(tick)
      else:
         umaxL.update(tick)
      return self.finalALB(uAs,umaxL,uB)
#specific tree node tick evaluation of a temporal cycle operator:
# s0 = s1 ##[m:n] s2
   def respEvalTick(self, tick):
      umaxL,uB = { },{ } #initialize to empty sets
      As,maxL,B = self.s1.respEvalSet({tick})
      umaxL.update(maxL)
      uB.update(B)
      if As.ticks( ):
         As,ignore,B = self.##[m:n].respEvalSet(As)
         uB.update(B)
      if As.ticks( ):
         As,maxL,B = self.s2.respEvalSet(As)
         umaxL.update(maxL)
         uB.update(B)
      return self.finalALB(As,umaxL,uB)
#specific tree node tick evaluation of a cycle delay: ##[m:n]
   def respEvalTick(self, tick):
      uAs,umaxL,uB = { },{ },{ } #initialize to empty sets
      N = self.cycleRange[0]
      while N != None:
         if (N+tick) > lastTick:
            uB.update(lastTick)
            break
         else:
            uAs.update(N+tick)
         N = self.getNextRangeNum(N, self.cycleRange)
      return self.finalALB(uAs,umaxL,uB)
#specific tree node tick evaluation of a repetition operator:
# s0 = s1[*m:n], m > 0 and m <= n
   def respEvalTick(self, tick):
      uAs,umaxL,uB = { },{ },{ } #initialize to empty sets
      rStart, rOffset = self.repeatRange
      iAs = {tick}
      lastLoop = rStart + rOffset
      loop = 0
      while (rOffset == -1) or (loop < lastLoop):
         loop = loop + 1
         # evaluate child for this loop
         As,maxL,B = s1.respEvalSet(iAs)
         umaxL.update(maxL)
         uB.update(B)
         if not As.ticks( ): break
         # propagate alives if m reached
         if loop >= rStart:
            uAs.update(As)
         if (rOffset == -1) or (loop < lastLoop):
            # more loops to evaluate
            As,ignore,B, ignore = self.[*m:n].respEvalSet(As)
            uB.update(B)
            if not As.ticks( ): break
         else:
            break
         iAs = As
      return self.finalALB(uAs,umaxL,uB)
#specific tree node tick evaluation of the or operator:
# s0 = s1 or s2
   def respEvalTick(self, tick):
      As1,maxL1,B1 = self.s1.respEvalSet({tick})
      As2,maxL2,B2 = self.s2.respEvalSet({tick})
      return self.finalALB({As1} union {As2}, {maxL1} union {maxL2}, {B1} union {B2})
#specific tree node tick evaluation of the and operator:
# s0 = s1 and s2
   def respEvalTick(self, tick):
      uAs,umaxL,uB = { },{ },{ }
      As1,maxL1,B1 = self.s1.respEvalSet({tick})
      As2,maxL2,B2 = self.s2.respEvalSet({tick})
      live1 = As1.nonEmpty( ) or B1.nonEmpty( )
      live2 = As2.nonEmpty( ) or B2.nonEmpty( )
```

APPENDIX-continued

Algorithm Description Pseudocode
Copyright (c) 2004 Synopsys, Inc.

```
        aliveAtTick = Infinity
        if As1.nonEmpty( ) and As2.nonEmpty( ):
            aliveAtTick = max(As1.min( ), As2.min( ))
        diesAtTick = Infinity
        if not live1: diesAtTick = maxL1.max( )
        if not live2: diesAtTick = min((diesAtTick, maxL2.max( )))
        for tick in {As1,As2}.ticks( ):
            if (tick >= aliveAtTick) and (tick <= diesAtTick):
                uAs.update(tick)
        for tick in {maxL1, maxL2}.ticks( ):
            if tick <= diesAtTick:
                umaxL.update(tick)
        if (B1.nonEmpty( ) and live2) or (B2.nonEmpty( ) and live1):
            uB.update(lastTick)
        return self.finalALB(uAs,umaxL,uB)
# throughout operator:
# s0 = b0 throughout s1
    def respEvalTick(self, tick):
        uAs,umaxL,uB = { },{ },{ }
        As1,maxL1,B1 = self.s1.respEvalSet({tick})
        hiTick = As1.max(maxL1)
        if B1.nonEmpty( ):
            hiTick = lastTick
        for t in range(tick, 1+hiTick):
            As0,maxL0,ignore = self.b0.respEvalTick(t)
            if As0.nonEmpty( ):
                if t in As1.ticks( ):
                    uAs.update(t)
                elif t in maxL1.ticks( ):
                    umaxL.update(t)
                else:
                    umaxL.update(t)
                    break
            else:
                uB.update(B1)
        return self.finalALB(uAs,umaxL,uB)
# overlapped implies operator, with and without not:
# s1 |-> s2
# s1 |-> not s2
    def respEvalTick(self, tick):
        uAs,umaxL,uB = { },{ },{ }
        As1,maxL1,B1 = self.s1.respEvalSet({tick})
        if As1.nonEmpty( ):
            iminF = None
            imaxP = None
            iB = 0
            for t in As1.ticks( ):
                As2,maxL2,B2 = self.s2.respEvalSet({t})
                P2,F2,aB2 = self.ALBtoPFB(As2,maxL2,B2)
                if self.impliesNot:
                    P2,F2,aB2 = self.notPFB(P2,F2,aB2)
                if F2:
                    if iminF:
                        iminF = min((iminF, F2))
                    else:
                        iminF = F2
                elif P2:
                    imaxP = max((imaxP, P2))
                else:
                    iB = lastTick
            if B1.nonEmpty( ):
                iB = lastTick
            P,F,aB = None,None,0
            if iminF:
                F = iminF
            elif iB:
                aB = lastTick
            elif imaxP:
                P = imaxP
            uAs,umaxL,uB = self.PFBtoALB(P,F,aB)
        elif B1.nonEmpty( ):
            uB.update(B1)
        else:
            # vacuously true
            uAs.update(maxL1)
        return self.finalALB(uAs,umaxL,uB)
```

APPENDIX-continued

Algorithm Description Pseudocode
Copyright (c) 2004 Synopsys, Inc.

```
# final cleanup of the ALB vector
    def finalALB(self, As,maxL,B):
        if maxL.nonEmpty( ):
            x = maxL.max( )
            maxL = { }
            if not (B.nonEmpty( ) or (As.max( ) > x)):
                maxL.update(x)
        return (As,maxL,B)
```

The invention claimed is:

1. A computer implemented method for evaluating an assertion expression about a circuit design, the assertion expression having a hierarchy of subexpressions, the hierarchy having a plurality of leaf subexpressions, at least one intermediate subexpression each expressing a portion of the assertion expression in terms of at least one member of the group consisting of the leaf subexpressions and other intermediate subexpressions, and a root expression representing the entire assertion expression in terms of at least one member of the group consisting of the leaf subexpressions and the intermediate subexpressions, for use with a source indicating the status of each binary signal affecting the assertion expression on each of a plurality of clock ticks in an evaluation period, comprising the steps of:

evaluating the assertion expression against the binary signals from the source, for a subject assertion attempt beginning within the evaluation period; and reporting status information of at least one of the intermediate subexpressions.

2. A method according to claim 1, wherein the status information reported in the step of reporting, for a particular one of the intermediate subexpressions, indicates the final status of the particular subexpression in response to the subject assertion attempt, at least to the extent determined by the end of the evaluation period.

3. A method according to claim 2, wherein the step of reporting comprises the step of, where the evaluation period terminates before the subject assertion attempt terminates, reporting indeterminate status at least one of the intermediate subexpressions.

4. A method according to claim 3, wherein the step of reporting further comprises the step of reporting the pass/fail status of at least one of the intermediate subexpressions.

5. A method according to claim 2, wherein the step of reporting comprises the step of reporting the pass/fail status of at least one of the intermediate subexpressions.

6. A method according to claim 1, wherein the status information reported in the step of reporting, for a particular one of the intermediate subexpressions, indicates tick-by-tick status of the intermediate subexpression.

7. A method according to claim 1, wherein the source comprises a simulation mechanism for simulating the circuit design, further comprising the steps of:

simulating the circuit design through a plurality of clock ticks in a simulation period that includes the evaluation period; and providing the status of each binary signal affecting the assertion expression on each of the plurality of clock ticks in the evaluation period.

8. A method according to claim 7, wherein the step of providing completes for all clock ticks in the plurality of clock ticks, before the step of evaluating begins.

9. A method according to claim 1, wherein the step of evaluating begins, for one clock tick in the plurality of clock ticks, before the step of providing completes for all clock ticks in the plurality of clock ticks.

10. A method according to claim 9, wherein the evaluation period has no predefined duration.

11. A method according to claim 1, wherein the source indicates the status of each binary signal affecting the assertion expression for all clock ticks in the plurality of clock ticks, before the step of evaluating begins.

12. A method according to claim 1, wherein each of the leaf subexpressions is a member of the group consisting of (a) a binary constant, (b) the binary signals provided by the source, and (c) a purely combinational function of members of the group consisting of a binary constant and the binary signals provided by the source.

13. A method according to claim 1, wherein the step of evaluating comprises the steps of:
identifying on which if any ticks each subexpression of the root expression is alive in response to the subject assertion attempt; and
in dependence upon the ticks identified in the step of identifying, determining the status of the root expression in response to the subject assertion attempt.

14. A method according to claim 13, wherein the step of reporting comprises the step of reporting, for each subexpression of the root expression, the ticks identified as being alive in response to the subject assertion attempt.

15. A method according to claim 14, further comprising the step of identifying on which if any ticks each subexpression of the root expression is dead in response to the subject assertion attempt,
and wherein the step of reporting comprises the step of reporting, for each subexpression of the root expression, the ticks identified as being dead in response to the subject assertion attempt.

16. A method according to claim 13, wherein the step of identifying includes the step of identifying on which if any ticks a temporal operator of the root expression is alive in response to the subject assertion attempt.

17. A method according to claim 13, wherein the step of identifying on which if any ticks each subexpression of the root expression is alive in response to the subject assertion attempt, comprises the steps of:
evaluating a particular one of the subexpressions against the binary signals from the source, for each of a set of at least one assertion sub-attempt developed in response to the subject assertion attempt, each such evaluation returning a respective set of zero or more alive ticks; and
taking the union of all of the sets of alive ticks returned in the step of evaluating a particular one of the subexpressions.

18. A method according to claim 17, further comprising the step of caching, in conjunction with the particular subexpression, the set of alive ticks returned for a particular one of the assertion sub-attempts.

19. A method according to claim 18, wherein the step of evaluating a particular one of the subexpressions against the binary signals from the source, for the particular assertion sub-attempt, comprises the step of retrieving a set of zero or more alive ticks from a cache.

20. A method according to claim 1, further comprising the step of organizing the hierarchy of subexpressions as a tree having a plurality of nodes, each child node in the plurality of nodes representing a subexpression operand of the expression of its parent node, the plurality of nodes including a root node representing the entire assertion expression.

21. A method according to claim 20, wherein one of the nodes further has an additional child node not in the plurality of nodes.

22. A method according to claim 20, wherein the step of evaluating the assertion expression against the binary signals from the source comprises the step of evaluating the assertion expression recursively through the tree.

23. A method according to claim 20, wherein the step of evaluating comprises, for each given node in the plurality of nodes which has a child node representing a subexpression operand of the expression of the given node, and for a given input tick to the given node, the steps of:
evaluating the subexpression of the child node against the binary signals from the source, for each of a set of at least one assertion sub-attempt developed in response to the given input tick, each such evaluation returning a respective set of zero or more alive ticks; and
returning to the given node a set of alive ticks in dependence upon the sets of alive ticks returned in the step of evaluating the subexpression of the child node.

24. A method according to claim 23, wherein the given node further has a second child node representing a second subexpression operand of the expression of the given node,
further comprising the step of evaluating the subexpression of the second child node against the binary signals from the source, for each of a set of at least one assertion sub-attempt developed in response to the given input tick, each such evaluation returning a respective set of zero or more alive ticks,
and wherein the set of alive ticks returned to the given node in the step of returning, further depends on the sets of alive ticks returned in the step of evaluating the subexpression of the second child node.

25. A method according to claim 23, wherein the given node further has an operator child node representing an operator of the given node,
further comprising the step of evaluating the operation of the operator child node for each of a set of at least one assertion sub-attempt developed in response to the given input tick, each such evaluation returning a respective set of zero or more alive ticks,
and wherein the set of alive ticks returned to the given node in the step of returning, further depends on the sets of alive ticks returned in the step of evaluating the subexpression of the operator child node.

26. A method according to claim 23, wherein the step of reporting comprises the step of reporting, in association with each subexpression of the root expression, the ticks identified as being alive in response to the subject assertion attempt.

27. A method according to claim 23, wherein the step of evaluating the subexpression of the child node comprises the steps of:
calling a set evaluation method of the child node with the set of at least one assertion sub-attempt as an input set;
the set evaluation method, for each individual element in the input set, calling a tick evaluation method of the child node with the individual element as an input tick;
the tick evaluation method returning a set of zero or more alive ticks in dependence upon each call made in the step of calling a tick evaluation method;
the set evaluation method combining the sets of alive ticks returned from all calls made in the step of calling a tick evaluation method, the set of alive ticks returned to the given node being dependent upon the combined set developed in the step of the set evaluation method combining.

28. A method according to claim 27, further comprising the step of the set evaluation method caching, in conjunction with the child node, and identified by the input tick for each particular one of the calls to the tick evaluation method, the set of alive ticks returned by the tick evaluation method in response to the particular call.

29. A method according to claim 23, wherein the step of evaluating the subexpression of the child node comprises the steps of:
   calling a set evaluation method of the child node with the set of at least one assertion sub-attempt as an input set;
   the set evaluation method, for each individual element in the input set, determining whether a set of alive ticks returned from a tick evaluation method of the child node called previously for the individual element has already been cached, and if not, calling the tick evaluation method of the child node with the individual element as an input tick;
   the tick evaluation method returning a set of zero or more alive ticks in response to each call made in the step of calling a tick evaluation method;
   the set evaluation method caching, in conjunction with the child node, and identified by the input tick for each particular one of the calls to the tick evaluation method, the set of alive ticks returned by the tick evaluation method in response to the particular call; and
   the set evaluation method combining the sets of alive ticks cached in conjunction with the child node for all elements of the input set,
   the set of alive ticks returned to the given node being dependent upon the combined set developed in the step of the set evaluation method combining.

30. A method according to claim 1, further comprising the step of evaluating the assertion expression against the binary signals from the source, for an additional assertion attempt beginning within the evaluation period.

31. A method according to claim 30, further comprising the step of reporting failure of the assertion expression if evaluation of the assertion expression for at least one of the subject and additional assertion attempts fails.

32. A computer program product for evaluating an assertion expression about a circuit design, the assertion expression having a hierarchy of subexpressions, the hierarchy having a plurality of leaf subexpressions, at least one intermediate subexpression each expressing a portion of the assertion expression in terms of at least one member of the group consisting of the leaf subexpressions and other intermediate subexpressions, and a root expression representing the entire assertion expression in terms of at least one member of the group consisting of the leaf subexpressions and the intermediate subexpressions, for use with a source indicating the status of each binary signal affecting the assertion expression on each of a plurality of clock ticks in an evaluation period, the computer program product comprising:
   code for evaluating the assertion expression against the binary signals from the source, for a subject assertion attempt beginning within the evaluation period; and
   code for reporting status information of at least one of the intermediate subexpressions.

33. A system for evaluating an assertion expression about a circuit design, the assertion expression having a hierarchy of subexpressions, the hierarchy having a plurality of leaf subexpressions, at least one intermediate subexpression each expressing a portion of the assertion expression in terms of at least one member of the group consisting of the leaf subexpressions and other intermediate subexpressions, and a root expression representing the entire assertion expression in terms of at least one member of the group consisting of the leaf subexpressions and the intermediate subexpressions, for use with a source indicating the status of each binary signal affecting the assertion expression on each of a plurality of clock ticks in an evaluation period, the system comprising:
   a memory;
   a data processor coupled to the memory, the data processor configured to:
   evaluate the assertion expression against the binary signals from the source, for a subject assertion attempt beginning within the evaluation period; and
   report status information of at least one of the intermediate subexpressions.

34. Apparatus for evaluating an assertion expression about a circuit design, the assertion expression having a hierarchy of subexpressions, the hierarchy having a plurality of leaf subexpressions, at least one intermediate subexpression each expressing a portion of the assertion expression in terms of at least one member of the group consisting of the leaf subexpressions and other intermediate subexpressions, and a root expression representing the entire assertion expression in terms of at least one member of the group consisting of the leaf subexpressions and the intermediate subexpressions,
   for use with a source indicating the status of each binary signal affecting the assertion expression on each of a plurality of clock ticks in an evaluation period,
   comprising a data structure organizing the hierarchy of subexpressions as a tree having a plurality of node objects, each child node object in the plurality of node objects representing a subexpression operand of the expression of its parent node object, the plurality of node objects including a root node object representing the entire assertion expression,
   each of the node objects having a set evaluation method and a tick evaluation method,
   the set evaluation method of each given one of the node objects, for each individual element in an input set of alive ticks, operable to call the tick evaluation method of the given node object with the individual element as an input tick,
   the tick evaluation method of the given node object operable to return a set of zero or more alive ticks in response to each call made to the tick evaluation method,
   the set evaluation method of the given node object operable to combine the sets of alive ticks returned from all of the calls made by the set evaluation method of the given node object to the tick evaluation method of the given node object, and returning the combined set of alive ticks to a caller of the set evaluation method of the given node object.

35. Apparatus according to claim 34, wherein for each particular node object in the plurality of node objects which has a child node object representing a subexpression operand of the expression of the particular node object, and for a particular input tick to the given node object, the tick evaluation method of the particular node object is operable, in response to being called with an input alive tick, to:
   call the set evaluation method of at least one child node object of the particular node object, providing the input alive tick as an input tick, and develop the set of zero or more alive ticks for returning to the caller in dependence upon a set of zero or more alive ticks returned from the set evaluation method of the at least one child node object.

36. Apparatus according to claim 34, wherein the set evaluation method of each particular node object in the plurality of node objects includes a cache of transformations, from a particular input alive tick to an output set of alive ticks returned by the tick evaluation method of the particular node object when called with particular input alive tick.

* * * * *